(12) United States Patent
Chou et al.

(10) Patent No.: US 11,049,557 B2
(45) Date of Patent: Jun. 29, 2021

(54) LEAKAGE CURRENT COMPENSATION IN CROSSBAR ARRAY

(71) Applicant: Macronix International Co., Ltd., Hsinchu (TW)

(72) Inventors: Yun-Chen Chou, Hsinchu (TW); Yung-Feng Lin, Taoyuan (TW); Hsin-Yi Ho, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/517,485

(22) Filed: Jul. 19, 2019

(65) Prior Publication Data

US 2021/0020235 A1     Jan. 21, 2021

(51) Int. Cl.
*G11C 13/00* (2006.01)
*H01L 27/24* (2006.01)

(52) U.S. Cl.
CPC .......... *G11C 13/003* (2013.01); *G11C 13/004* (2013.01); *G11C 13/0026* (2013.01); *G11C 13/0028* (2013.01); *G11C 13/0038* (2013.01); *G11C 13/0069* (2013.01); *H01L 27/2463* (2013.01); *G11C 2013/0045* (2013.01); *G11C 2013/0078* (2013.01)

(58) Field of Classification Search
CPC .............. G11C 13/003; G11C 13/0026; G11C 13/0028; G11C 13/0038; G11C 13/004; G11C 13/0069; G11C 13/0045; G11C 13/0078
USPC ..................... 365/189.14, 145, 173, 171, 172
See application file for complete search history.

(56) References Cited

U.S. PATENT DOCUMENTS

| | | | |
|---|---|---|---|
| 6,269,018 B1 * | 7/2001 | Monsma | G11C 11/15 365/145 |
| 7,719,913 B2 | 5/2010 | Lung et al. | |
| 8,406,033 B2 | 3/2013 | Lung et al. | |

(Continued)

FOREIGN PATENT DOCUMENTS

| | | |
|---|---|---|
| JP | 2002216467 A | 8/2002 |
| JP | 2011054232 A | 3/2011 |

(Continued)

OTHER PUBLICATIONS

Cassuto et al., "Sneak-Path Constraints in Memristor Crossbar Arrays," IEEE Int'l Symp. on Information Theory, Jul. 2013, pp. 156-160.

(Continued)

*Primary Examiner* — Connie C Yoha
(74) *Attorney, Agent, or Firm* — Haynes Beffel & Wolfeld LLP

(57) ABSTRACT

A mechanism is described for accommodating variations in the read or write window which are caused by variations in the number of half-selected cells which are in each logic state and share an access line with the target cell. Roughly described, leakage current is detected on the access line in one segment of the read or write operation, and read or write current detected or generated in a second segment of the operation is adjusted to compensate for the detected leakage current. The first segment can be omitted in subsequent read or write operations if the target cell word line address has not changed and the leakage-tracked reference value has not become invalid for other reasons.

21 Claims, 28 Drawing Sheets

(56) References Cited

U.S. PATENT DOCUMENTS

| | | | |
|---|---|---|---|
| 9,070,456 B2* | 6/2015 | Agan | ............... G11C 11/1673 |
| 9,299,430 B1 | 3/2016 | Bertin et al. | |
| 10,049,733 B2 | 8/2018 | Muralimanohar et al. | |
| 10,332,595 B2 | 6/2019 | Jeon | |
| 2002/0126524 A1 | 9/2002 | Sugibayashi et al. | |
| 2008/0094876 A1 | 4/2008 | Siau et al. | |
| 2011/0051495 A1 | 3/2011 | Ito | |
| 2014/0211539 A1 | 7/2014 | Kanno et al. | |

FOREIGN PATENT DOCUMENTS

| | | |
|---|---|---|
| JP | 2014146406 A | 8/2014 |
| WO | 2013080483 A1 | 6/2013 |
| WO | 2016068992 A1 | 5/2016 |
| WO | 2016137437 A1 | 9/2016 |
| WO | 2016137449 A1 | 9/2016 |

OTHER PUBLICATIONS

TW Office Action in TW10920783070 dated Aug. 18, 2020, 8 pages.
JP Office Action from JP 2019-175089 dated Nov. 24, 2020, 7 pages.
EP Partial Search Report in 19196313.1-1224 dated Mar. 30, 2020, 17 pages.
JP Allowance from JP 2019-175089 dated Mar. 3, 2021, 3 pages.

\* cited by examiner

RU: RESET cell upper bound
RL: RESET cell lower bound
SU: SET cell upper bound
SL: SET cell lower bound
REF: Reference read bias

LEAKAGE CURRENT COMPENSATION IN CROSSBAR ARRAY

BACKGROUND

Field

The present invention relates to crossbar memory arrays, and more particularly to improving the reliability of accessing such arrays.

Description of Related Art

FIG. 1A illustrates a plan view of a 4×4 cell section of a typical crossbar memory array. It includes two metal layers. In one metal layer there are formed several parallel primary access lines (e.g. word lines) 114, and in the next metal layer there are formed several secondary access lines (e.g. bit lines) 112 crossing the primary access lines. At every cross-point, the bit lines and word lines are fused with a resistive element to form a memory cell. Each cell occupies area $4F^2$, where F is the feature size. FIG. 1B is a schematic diagram of the crossbar memory array section of FIG. 1A. As can be seen, the resistive element forming each cell is a two terminal device, with one terminal connected to the word line 114 of the memory cell and the other terminal connected to the bit line 112 of the memory cell.

Though the crossbar array is able to achieve high area efficiency, it suffers from an Ioff sneak current path issue. FIG. 2 is the schematic diagram of FIG. 1B, with labels added. The bit lines 112 have been numbered BL0-BL3, and the word lines 114 have been numbered WL0-WL3. Bias voltages for a read operation of one particular selected cell 118 are also indicated. In particular, the bias voltage applied to the bit line of selected cell 118 (BL2 in FIG. 2) for a read operation is set to a voltage VBL, while the bias voltage applied to each of the other bit lines (BL0, BL1 and BL3 in FIG. 2) for the read operation are set to a voltage VUBL. Similarly, the bias voltage applied to the word line of selected cell 118 (WL1 in FIG. 2) for the read operation is set to a voltage VWL, while the bias voltage applied to each of the other word lines (WL0, WL2 and WL3 in FIG. 2) for the read operation are set to a voltage VUWL.

In one typically arrangement VBL>VUWL=VUBL>VWL. Thus the voltage across a fully selected cell such as 118 is VBL−VWL, which provides a current flow through the resistive element of the cell, whereas the voltage across a fully unselected cell such as 120 is VUBL−VUWL, which is zero. The voltage across a fully selected cell is sometimes referred to herein as read selection voltage difference, whereas the (nominally zero) voltage across a fully unselected cell is sometimes referred to herein as read non-selection voltage difference. However, the array also includes half selected cells 122, which are cells that share a word line (WL1 in FIG. 2) with the selected cell 118, but do not share the bit line (BL2 in FIG. 2). The voltage across a half-selected cell 122 is VUBL−VWL, which is non-zero. The voltage across a half-selected cell is sometimes referred to herein as read half-selection voltage difference. Thus the read current IRD resulting from selecting selected cell 118 is not exclusively due to the logic state of the resistive element in cell 118; current flows onto the output word line WL1 also from current paths that pass through the half-selected cells 122. In the example of FIG. 2, the read current resulting from biasing the array to read cell 118 is given by $$IRD_{12} = Icell_{12} + Ioff_{10} + Ioff_{11} + Ioff_{13},$$

where the $IRD_{mn}$ indicates the read current for selecting the cell at word line m (WL1 in FIG. 2) and bit line n (BL2 in FIG. 2), and $Ioff_{mn}$ indicates the current contribution of the half-selected cell at word line m (WL1 in FIG. 2) and bit line n (BL0, BL1 and BL3 in FIG. 2). The $Ioff_{mn}$ contributions are leakage currents.

The logic state of the selected cell can be determined by comparing IRD12 to a reference current which may be, for example, half way between the value of IRD12 when the selected cell is in its low resistance state, and the value of IRD12 when the selected cell is in its high resistance state. FIG. 5a is a heuristic graph showing ideal probability distributions for high resistance state (left-hand hump) and low resistance state (right-hand hump) in a programmable resistance memory device, such as that shown in FIG. 1. Referring to FIG. 5a, the horizontal axis represents the observed read current, and the vertical axis represents the probability that the IRD will be at each particular read current value if the selected cell is in the Reset state (left-hand hump) or Set state (right-hand hump). The uncertainty in these values can arise from many possible reasons, depending on memory cell technology. For chalcogenide based memory, for example, environmental conditions can result in drift in the resistance due to re-crystallization of small portions of the active region. Other issues can arise in other types of programmable resistance memory materials.

It can be seen that if the selected cell is in the Reset state, the observed IRD will be between lower and upper Reset state bounds, RL and RU. If it is in the Set state, then the observed IRD will be between lower and upper Set state bounds, SL and SU. It can be seen further that as long as SL>RU, a so-called "read window" is defined by the bounds RU and SL, and the reference current can be placed at the middle of the read window. If the observed IRD is below the reference current, then the selected cell is interpreted as being in the Reset state. If it is above the reference current, then the selected cell is interpreted as being in the Set state. (As used herein, a cell is considered to be in its "set" state if it is in its low resistance state, and is considered to be in its "reset" state if it is its high resistance state. Other implementations can use the opposite convention.)

However, Ioff is data pattern dependent. For example, if a half-selected cell is in its low resistance state, then it will contribute more leakage current than if it is in its high resistance state. Thus the read current for a selected cell IRDmn will be given by:

$$IRD_{mn} = Icell_{mn} + \Sigma_S Ioff(set) + \Sigma_R Ioff(reset),$$

where S is the number of half-selected cells sharing word line m which are in the Set state, R is the number of half-selected cells sharing word line m which are in the Reset state, and S+R is constant for a given word line (and typically for all word lines in the array). The potential impact of different numbers of Set-state and Reset-state half-selected cells can be thought of as a shift of the read window, left or right on the horizontal axis in FIG. 5a. This can be seen in FIG. 5b, which illustrates three cases. In the case of small Ioff (i.e. where most or all half-selected cells are in the Reset state), the read window is located toward the left (top drawing). In the case of large Ioff (i.e. where most or all half-selected cells are in the Set state), the read window is located toward the right (bottom drawing). And in the case of medium Ioff (i.e. where the number of half-selected cells which are in the Reset state approximately equals the number which are in the Set state), the read window is located intermediate between the bottom and top drawings. It can be seen that if the range of possible values of Ioff is large, the read window can shift so far in either direction that the reference current can no longer be used to determine whether an observed IRD represents a selected cell in the Set state or the Reset state. The need to minimize the range of possible positions of the read window can severely limit the flexibility with which a memory designer designs crossbar array memory.

SUMMARY

The present invention provides a mechanism for accommodating variations in the read window which are caused by variations in the number of half-selected cells which are in each logic state. Roughly described, the mechanism involves detecting the leakage current on a word line, and compensating for it by shifting the reference current to be within the resulting read window.

A read operation can include a first segment in which the data-dependent read current is detected and captured in a leakage-tracked reference value, and a second segment in which the target cell is read and compared to the leakage-tracked reference value. A sequence of consecutive read operations can be sped up by omitting the first read segment during the second and subsequent read operations, if the read word address has not changed and the leakage-tracked reference value has not become invalid for other reasons.

A write operation can make use of similar techniques.

The above summary is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Aspects of the invention apply in at least four situations: a read operation in which the sense amplifier senses currents on a selected word line; a read operation in which the sense amplifier senses currents on a selected bit line; a write operation in which the write current source is applied to a selected bit line; and a write operation in which the write current source is applied to a selected word line. This detailed description begins with the first situation, and later discusses the others.

Figure 10:
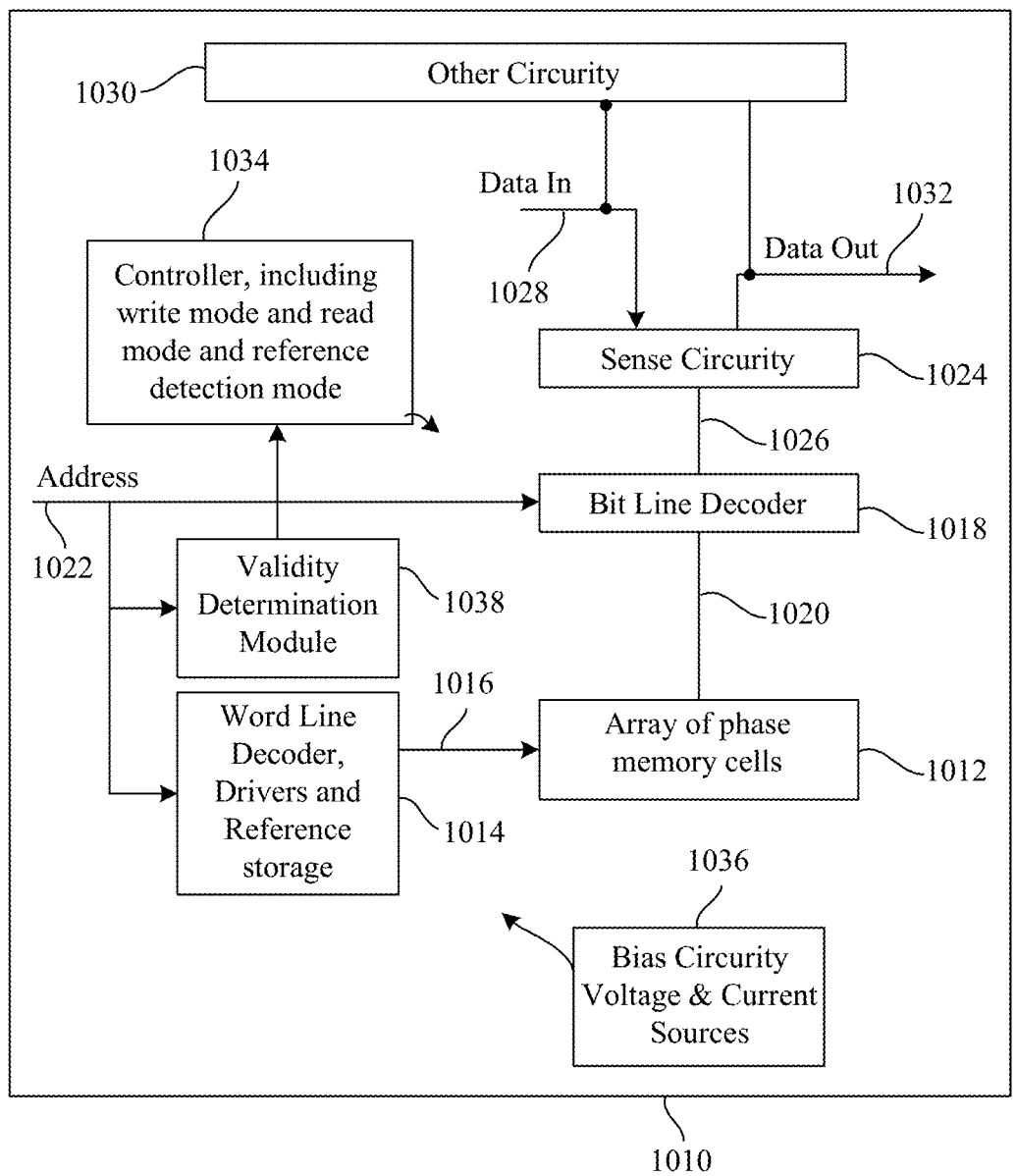
FIG. 10 is a simplified block diagram of an integrated circuit including a crossbar memory array incorporating aspects of the invention.

Before describing embodiments in detail, it will be useful to describe some aspects of an overall memory device in which aspects of the invention can be used. FIG. 10 is a simplified block diagram of an integrated circuit 1010 including a memory array 1012 implemented using programmable resistance memory cells, such as memory cells having phase change memory elements. Typically a memory cell is addressed by a multi-bit address, with one segment of the bits identifying the word line of the cell and another segment of the bits identifying the bit line of the cell. A word line decoder 1014 receives the word line bits of the target memory cell address, and is coupled to and in electrical communication with a plurality of word lines 1016 arranged along rows in the memory array 1012. A bit line (column) decoder 1018 receives the bit line bits of the target memory cell address, and is in electrical communication with a plurality of bit lines 1020 arranged along columns in the array 1012. In the embodiment of FIG. 10, the bit lines couple selected memory cells in array 1012 to sense amplifiers in sense circuitry 1024. Addresses are supplied on bus 1022 to word line decoder 1014 and bit line decoder 1018. Sense circuitry 1024, including sense amplifiers and data-in structures, is coupled to bit line decoder 1018 via data bus 1026. Data is supplied via a data-in line 1028 from input/output ports on integrated circuit 1010, or from other data sources internal or external to integrated circuit 1010, to data-in structures in sense circuitry 1024. Other circuitry 1030 may be included on integrated circuit 1010, such as a general-purpose processor or special purpose application circuitry, or a combination of modules providing system-on-a-chip functionality supported by array 1012. Data is supplied via a data-out line 1032 from the sense amplifiers in circuitry 1024 to input/output ports on integrated circuit 1010, or to other data destinations internal or external to integrated circuit 1010. The embodiment of FIG. 10 further includes a reference validity determination module 1038, the purpose of which is described hereinafter with reference to FIGS. 15a, et. seq.

A controller 1034 is implemented in this example using a state machine to execute processes described below, and controls the bias circuitry voltage and current sources 1036 for the application of bias arrangements for a Controller, including write mode and read mode and reference detection mode. Controller 1034 may be implemented using special-purpose logic circuitry as known in the art. In alternative embodiments, controller 1034 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1034.

The bias circuitry voltage and current sources in block 1036 can be implemented using power supply inputs with voltage dividers and charge pumps, current source circuitry, pulse shaping circuitry, timing circuitry and voltage and current switches as are known generally in the art but applied in a way that is appropriate to the techniques described herein.

In operation each of the memory cells in the array 1012 stores a logic value represented by the resistance of the corresponding memory element. The logic value may be determined, for example, by comparison of voltage or current on a bit line or word line for a memory cell targeted for reading, to that of a suitable reference current or voltage by sense amplifiers in sense circuitry 1024. The reference voltage or current can be established to be between a predetermined range corresponding to a data value such as logical "0", and a different predetermined range corresponding to a data value such as logical "1", using techniques described herein.

Reading or writing to a memory cell of array 1012, therefore, can be achieved by applying biasing arrangements including a suitable voltage to a selected one of the word lines and coupling a selected one of bit lines to a voltage source so that current flows through the target memory cell.

The write mode includes set and reset process for phase change memory. In biasing arrangements for a reset operation for a target phase change memory cell, word line decoder 1014 facilitates providing a word line with a suitable voltage pulse to turn on an access transistor of the memory cell. Bit line decoder 1018 facilitates supplying a voltage pulse to a bit line of suitable amplitude and duration to induce a current to flow though the target memory element, the current raising the temperature of the active region of the memory element above the transition temperature of the phase change material and also above the melting temperature to place the phase change material of the active region into a liquid state. The current is then terminated, for example, by terminating the voltage pulses on the bit line and on the word line, resulting in a relatively quick quenching time as the active region cools to a high resistance generally amorphous phase to establish a high resistance reset state in the memory cell. The reset operation can also comprise more than one pulse, for example using a pair of pulses.

In biasing arrangements for a set operation for a target phase change memory cell, word line decoder 1014 facilitates providing a selected word line with a suitable voltage pulse to turn on the access transistor of the target memory cell. Bit line decoder 1018 facilitates supplying a voltage pulse to a selected bit line of suitable amplitude and duration to induce a current to flow through the target memory element, the current pulse sufficient to raise the temperature of the active region above the transition temperature and cause a transition in the active region from the high resistance generally amorphous phase into a low resistance generally crystalline phase, this transition lowering the resistance of the memory element and setting the selected memory cell to the low resistance state.

In a read mode for the target memory cell, word line decoder 1014 facilitates providing a selected word line with a suitable voltage pulse to turn on the access transistor of the memory cell. Bit line decoder 1018 facilitates supplying a voltage to a selected bit line of suitable amplitude and duration to induce current to flow through the target memory element that does not result in the memory element undergoing a change in resistive state. The current on the selected bit line and through the target memory cell is dependent upon the resistance of, and therefore the logic state associated with, the target memory cell. Thus, the logic state of the target memory cell may be determined by detecting whether the resistance of the target memory cell corresponds to the high resistance state or the low resistance state, for example by comparison of a voltage or a current on the corresponding bit line with a suitable reference voltage or current (as described herein) by sense amplifiers of sense circuitry 1024.

In a reference detection mode the controller 1034 executes a procedure described in more detail below.

Figure 5A:
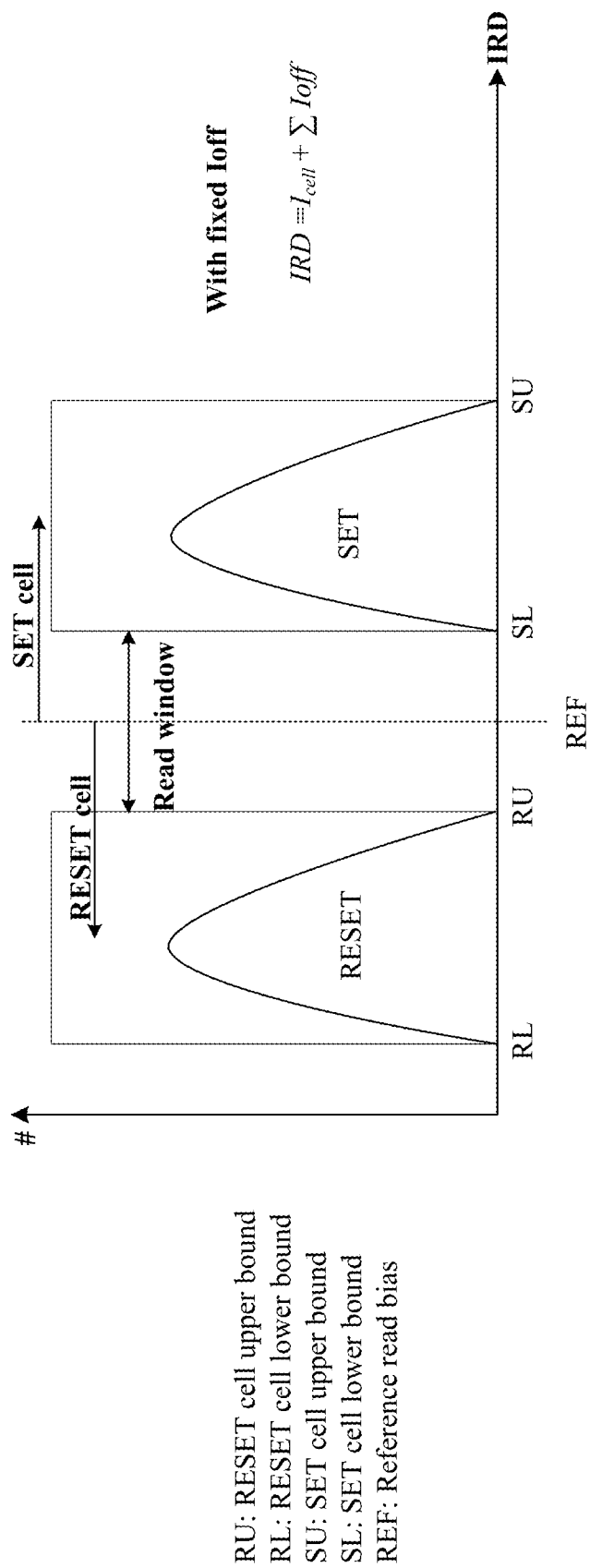
FIGS. 5a, 5b and 5c (collectively FIG. 5) are heuristic graphs of probability distributions for high and low resistance states in a programmable resistance memory device.
Figure 5B:
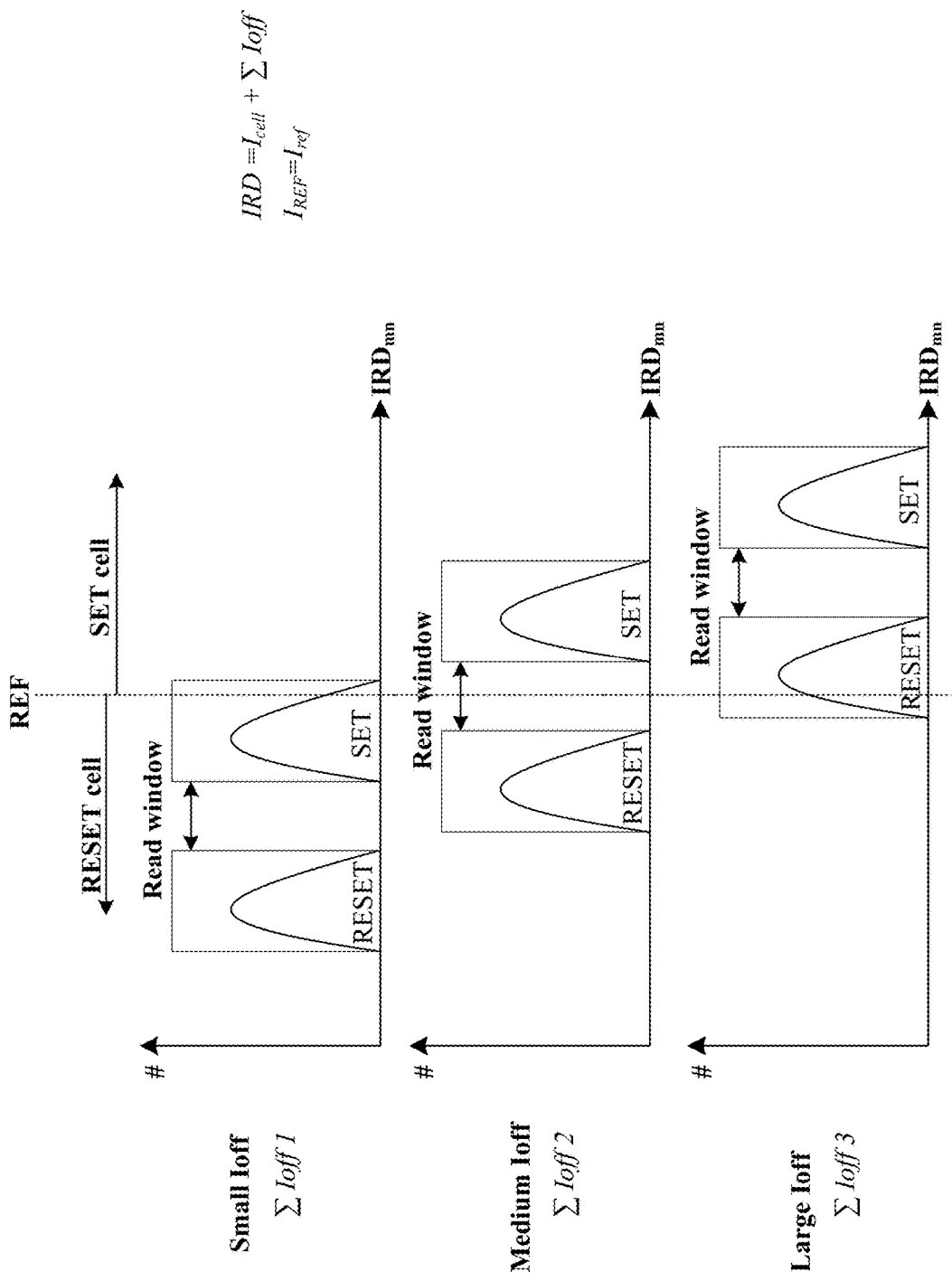
Figure 5C:
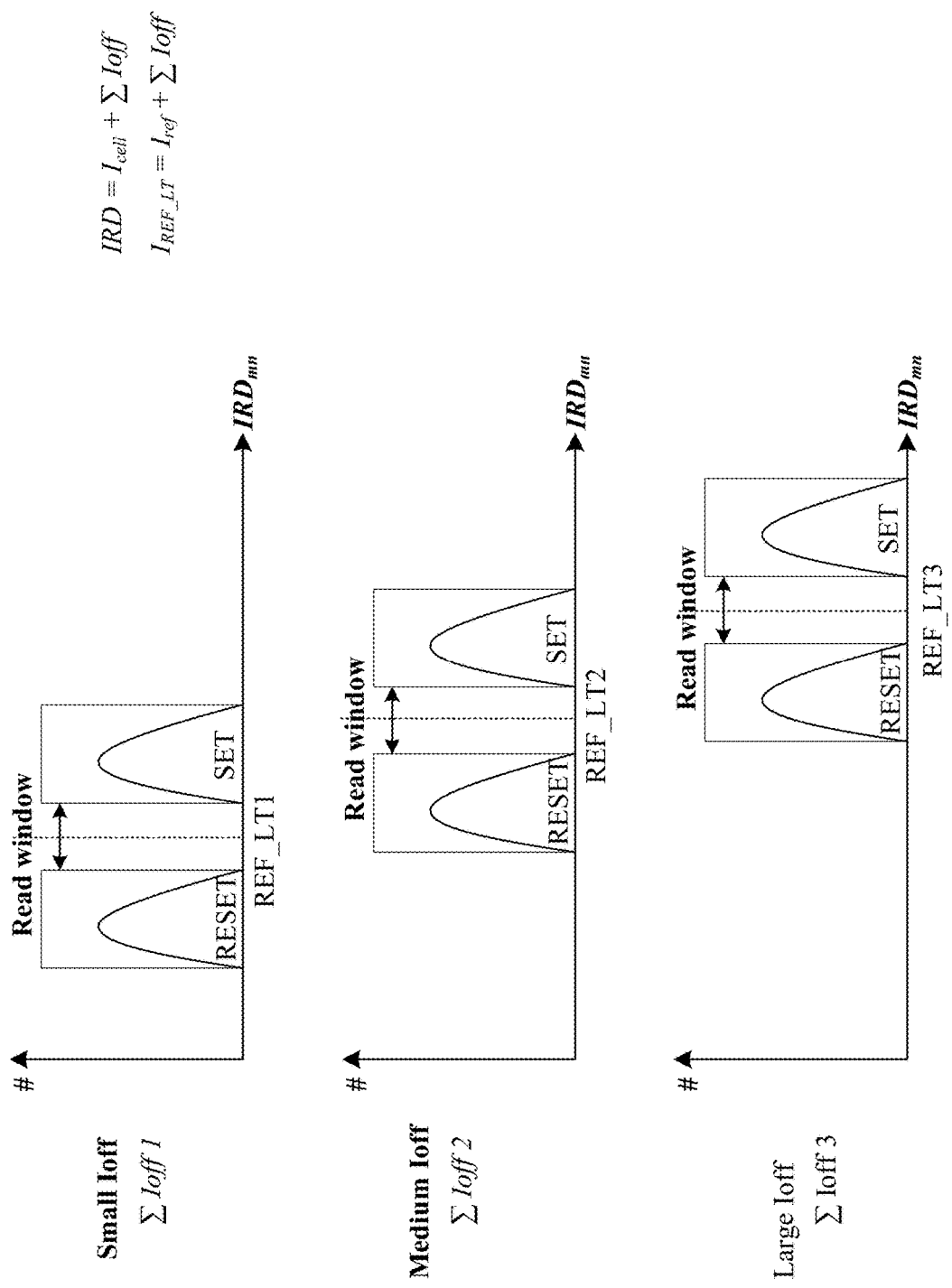

As mentioned above, the mechanism by which embodiments herein accommodate variations in the read window involves detecting the leakage current on a word line, and compensating for it by shifting the reference current to be within the resulting read window. This is illustrated heuristically in FIG. 5c. FIG. 5c illustrates the position of the read window in the same three cases as in FIG. 5b, except that the reference current is shifted in each case to be within the actual read window for the particular case.

Sensing of the state of a selected cell in embodiments described herein is performed by a voltage mode sense amplifier, which compares the voltage Vcell on the word line of the target cell to a reference voltage Vref. If Vcell is higher than Vref then the cell is considered to have one logic state, and if Vcell is lower than Vref then the cell is considered to have the opposite logic state. In an array in which a read current IRD is compared to a reference current Iref rather than comparing voltages, the currents can be converted to voltages so the selected cell's logic state may be sensed as just described. The read window thus can be expressed either in terms of a voltage window or a current window. FIG. 5c uses the current window formulation.

Without considering leakage currents, the read window is given by |IRD−Iref|, meaning the read current is compared to a fixed value Iref: if IRD is higher than Iref then the cell is considered to have one logic state, and if IRD is lower than Iref then the cell is considered to have the opposite logic state. But if leakage currents are present, then IRD can shift so far that it is difficult for the sense amplifier to distinguish the cell's logic state. Embodiments of the present invention can mitigate this problem by compensating for the actual leakage current. In particular, the read current ΣIoff for a particular word line is first detected, and then a new leakage tracking reference current $I_{REF\_LT}$ is determined as $$I_{REF\_LT}=Iref+\Sigma Ioff.$$

The read current for the selected cell is $$IRD=Icell+\Sigma Ioff.$$

The read window, given by |IRD−Iref| thus becomes $$|IRD-Iref|=|Icell+\Sigma Ioff-Iref-\Sigma Ioff|=|Icell-Iref|.$$

It can be seen that the effect of the leakage currents Ioff, whatever they might be, has been canceled out.

Figures 6A, 6B:
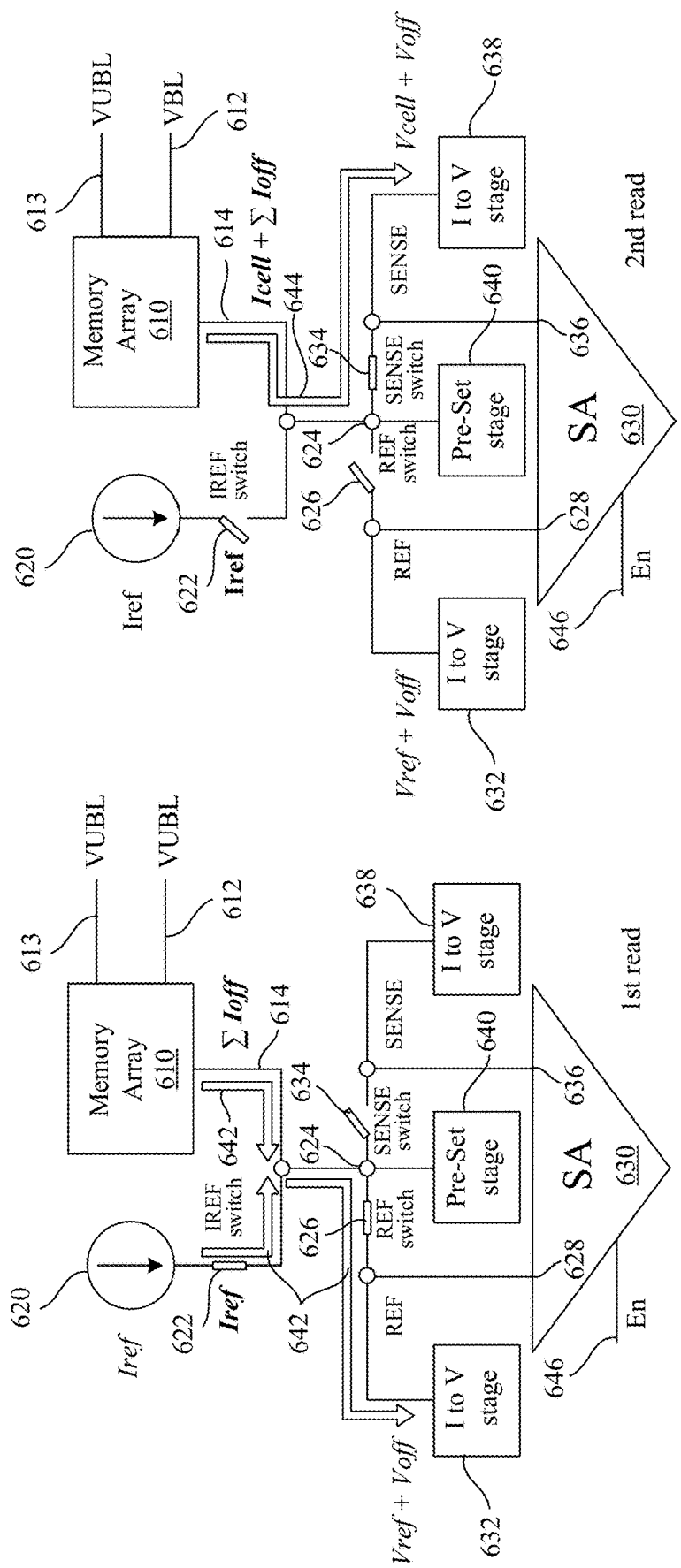
FIGS. 6a and 6b (collectively FIG. 6) are block diagrams of an arrangement which takes leakage current into account in a read operation.

FIG. 6a is a block diagram of an arrangement which takes the actual leakage current on a word line into account when reading data from a target memory cell. The current output of the word line of the target memory cell (sometimes referred to herein for convenience as the selected word line) 614 of memory array 610 is provided to a current summing node 624. The output 614 is a word line in the present embodiment, but in a different embodiment it can be a bit line. A reference current source 620 has a current output connected through a reference switch 622 to the current summing node 624. The current summing node 624 is connected through another reference switch 626 to a first input terminal 628 (also called a Reference input or Reference node) of a voltage mode sense amplifier 630. The input terminal 628 is also connected to a current-to-voltage converter stage 632, which may for example involve a capacitor series-connected to a fixed reference voltage as described below. The current summing node 624 is also connected through a sense switch 634 to the second input terminal 636 (also called the Sense terminal or Sense node) of sense amplifier 630. The second input terminal 636 is also connected to another current-to-voltage converter stage 638. The current summing node 624 is also connected to a preset stage 640. The sensing operation of the sense amplifier 630 is enabled by the controller 1034 at an appropriate time in the read operation by asserting the En signal 646.

The arrangement of FIG. 6a operates according to a two-step read operation, also referred to herein as a read operation having two read segments. The first segment involves obtaining the leakage current information and building up a leakage tracking read reference bias $V_{REF\_LT}$ at the first terminal 628 of the sense amplifier 630. The second segment involves converting the actual read current IRD to a read voltage VRD at the second terminal 636 of sense amplifier 630.

Thus in the first segment, the two reference switches 622 and 626 are closed (i.e. in their conducting, 'on' or 'enabled' state), and the sense switch 634 is open (non-conducting, 'off' or 'disabled'). The bias voltage VUBL for unselected cells is applied to all the bit lines of the memory array 610, including bit line 612 for the target cell as well as bit lines 613 for the cells to be unselected. Thus all the cells sharing the selected word line are "half-selected", and the current output on the selected word line 614 is ΣIoff. (The current output on word line 614 is actually slightly different than that, because the half-selected target cell is contributing as well. However, the difference is negligible for a large array, which is typical. Alternatively, bit line 612 for the target cell can be biased at VWL, in which case there is no contribution to ΣIoff from the target cell.) This current level is added to the reference current Iref from current source 620, and converted to a leakage tracked reference voltage $V_{REF\_LT}$=Vref+Voff by current-to-voltage stage 632. The relevant current flows are indicated in FIG. 6a by arrows 642. Next, in a second segment of the read operation, the two reference switches 622 and 626 are opened and the sense switch 634 is closed. The bias voltage VUBL for unselected cells is applied to all the bit lines 613 of the memory array 610 other than the selected bit line 612, to which the bias voltage VBL is applied. Thus the target cell is now fully selected, and all the other cells sharing the selected word line are "half-selected". The current output on the selected word line 614 is now Icell+ΣIoff. (Again it might be slightly different than that, but on a large array the difference is negligible.) This current level is converted to a voltage VRD=Vcell+Voff by current-to-voltage stage 638. FIG. 6b is a copy of the drawing of FIG. 6a, except with the switches in position for this second read segment. The relevant current flow for this second read segment is indicated in FIG. 6b by arrow 644. The sense amplifier 630 is then enabled, and compares the sensed voltage VRD to the leakage tracked reference voltage $V_{REF\_LT}$, which cancels out the data dependent effect of the half-selected cells.

Figure 1B:
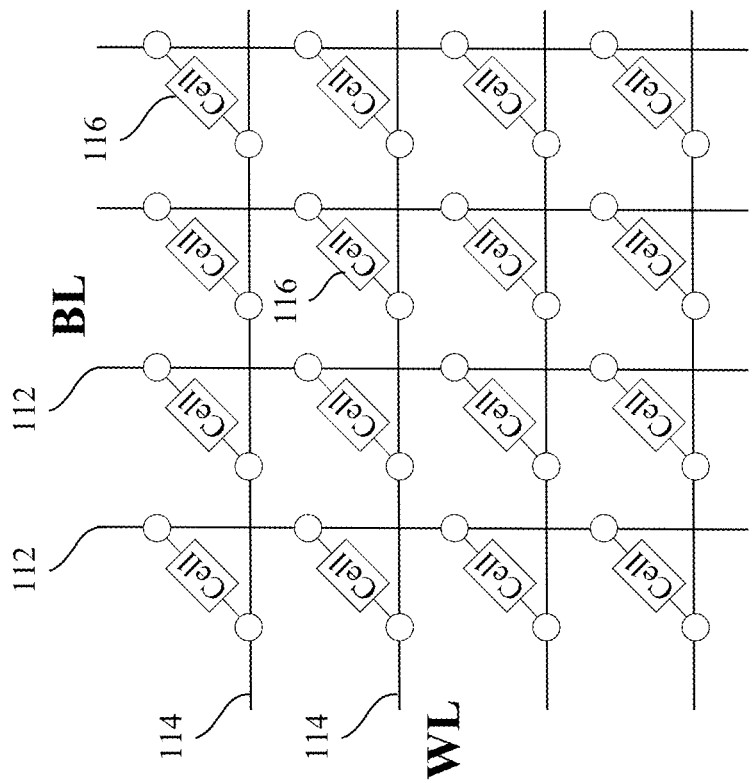
FIG. 1B is a schematic diagram of the crossbar memory array section of FIG. 1A.
Figure 1A:
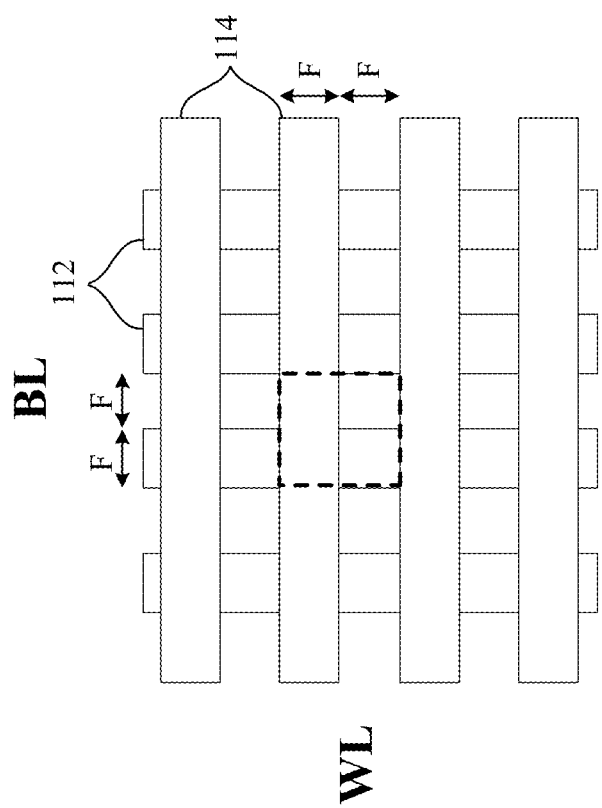
FIG. 1A illustrates a plan view of a 4×4 cell section of a typical crossbar memory array which can incorporate aspects of the invention.

Either or both steps of the read process can be facilitated by establishing a pre-charge voltage at the summing node 624. These are described with respect to FIGS. 7a, 7b, 8a and 8b. In these figures, the memory array 610 has been re-drawn in accordance with the 4×4 array as shown in FIG. 1B, in order to identify unselected cells, half-selected cells, fully selected cells and various current flows. In addition, certain components shown symbolically in FIGS. 6a and 6b have been replaced with example circuit-level components. Reference current source 620 has been implemented with a P-channel transistor having a bias voltage applied to its gate terminal; switches 622, 626 and 634 have been implemented with respective pass transistors 722, 772 and 734; current-to-voltage stages 632 and 638 have been implemented respectively as capacitors 732 and 738 to word line read bias VRD; and preset stage 640 has been implemented as a pass transistor to VRD. The capacitors 732 and/or 738 can be any type of capacitors, including for example MOS capacitors, MIM capacitors, metal line capacitors, parasitic capacitors and so on, as well as combinations of such devices. In general either or both of the I to V stages 632 and 638 can be implemented using "capacitance".

In operation, in a first read segment preset phase, preset paths are activated which establish VRD as an initial voltage at the Reference node 628 of the sense amplifier 630. This is accomplished by applying VUBL to all of the bit lines 612, 613, applying VUWL to all of the unselected word lines 115, turning on transistors 726 and 740, and turning off transistors 722 and 734, all concurrently. Thus with current flows indicated by arrows 742, the voltage on capacitor 732 is forced to VRD, as is the voltage on the selected word line 614. As used herein, "concurrent" application of biases and signals means that a time period exists in which they all are effective, though they do not all have to share start times, end times or durations.

Figure 7A:
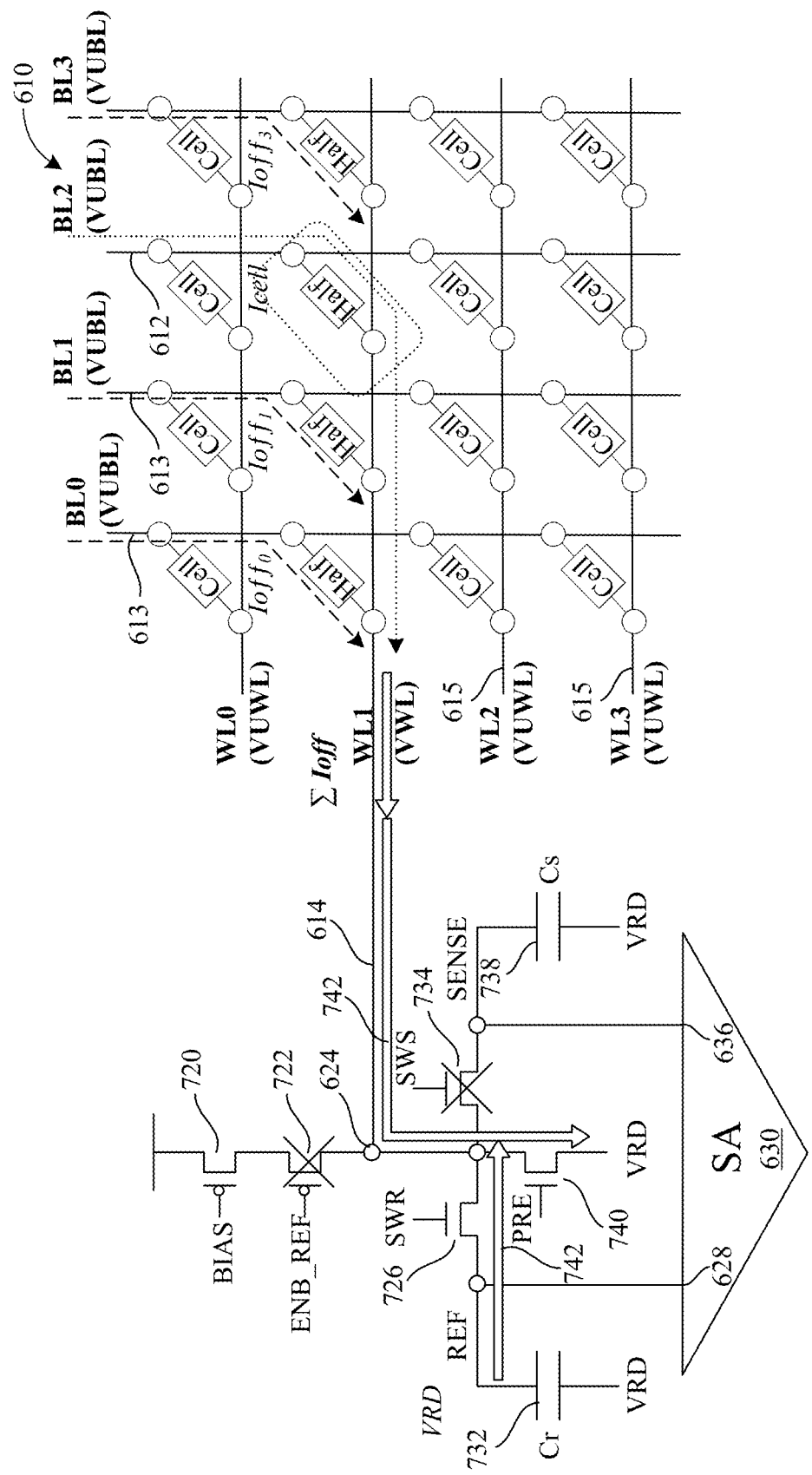
FIGS. 7a and 7b (collectively FIG. 7), and FIGS. 8a and 8b (collectively FIG. 8) illustrate a circuit implementation of the block diagrams of FIG. 6.
Figure 7B:
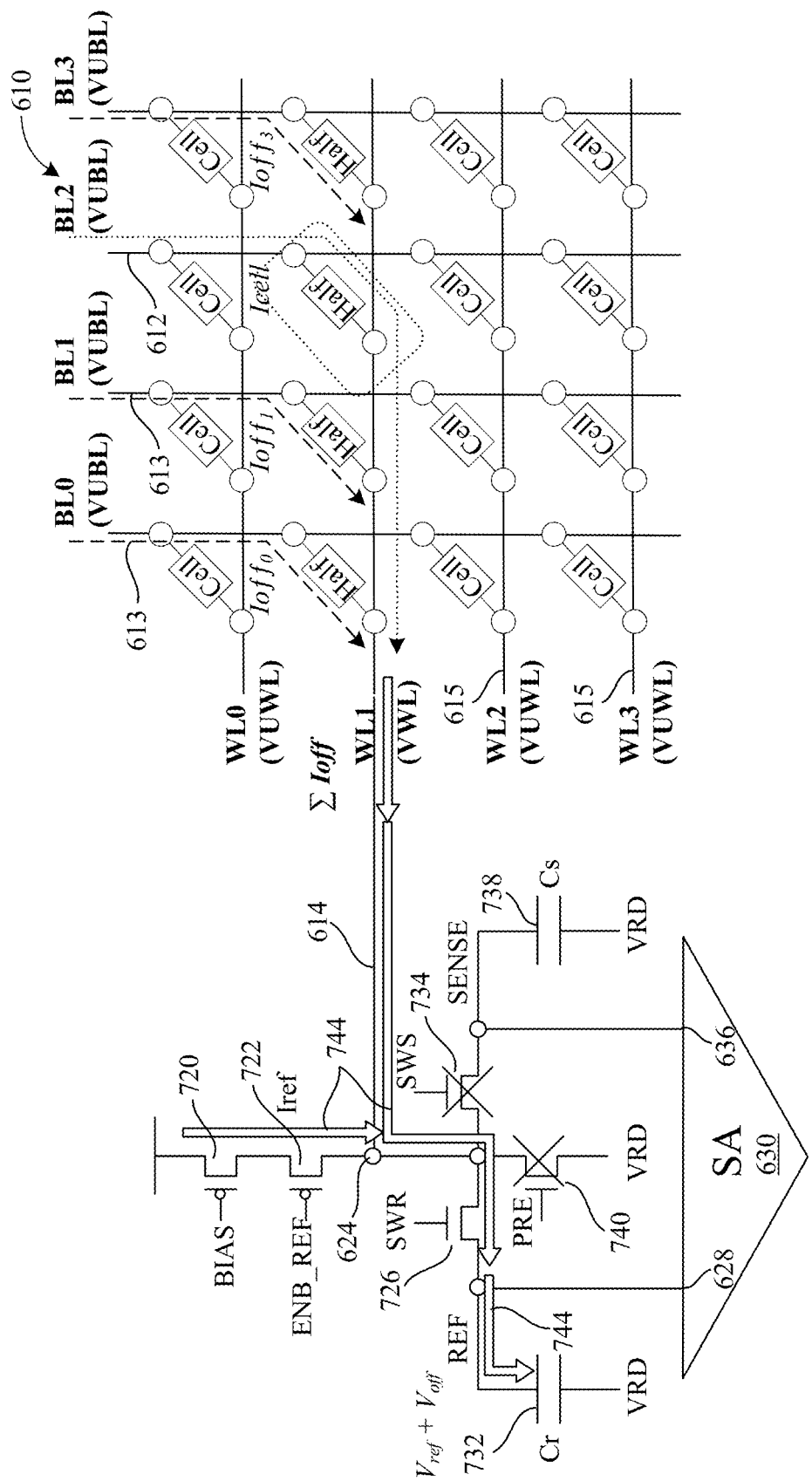

In a leakage capturing phase of the first read segment, the preset paths are turned off and a reference path is turned on. As shown in FIG. 7b, this involves turning off transistor 740 and turning on transistor 722. Transistor 734 remains off and transistor 726 remains on. VUBL remains applied to all of the bit lines 612, 613, and VUWL remains applied to all of the unselected word lines 115. As indicated by arrows 744, the resulting current flows of Iref+ΣIoff charge capacitor 732 to voltage Vref+Voff, which is a leakage tracking reference bias $V_{REF\_LT}$.

Figure 8A:
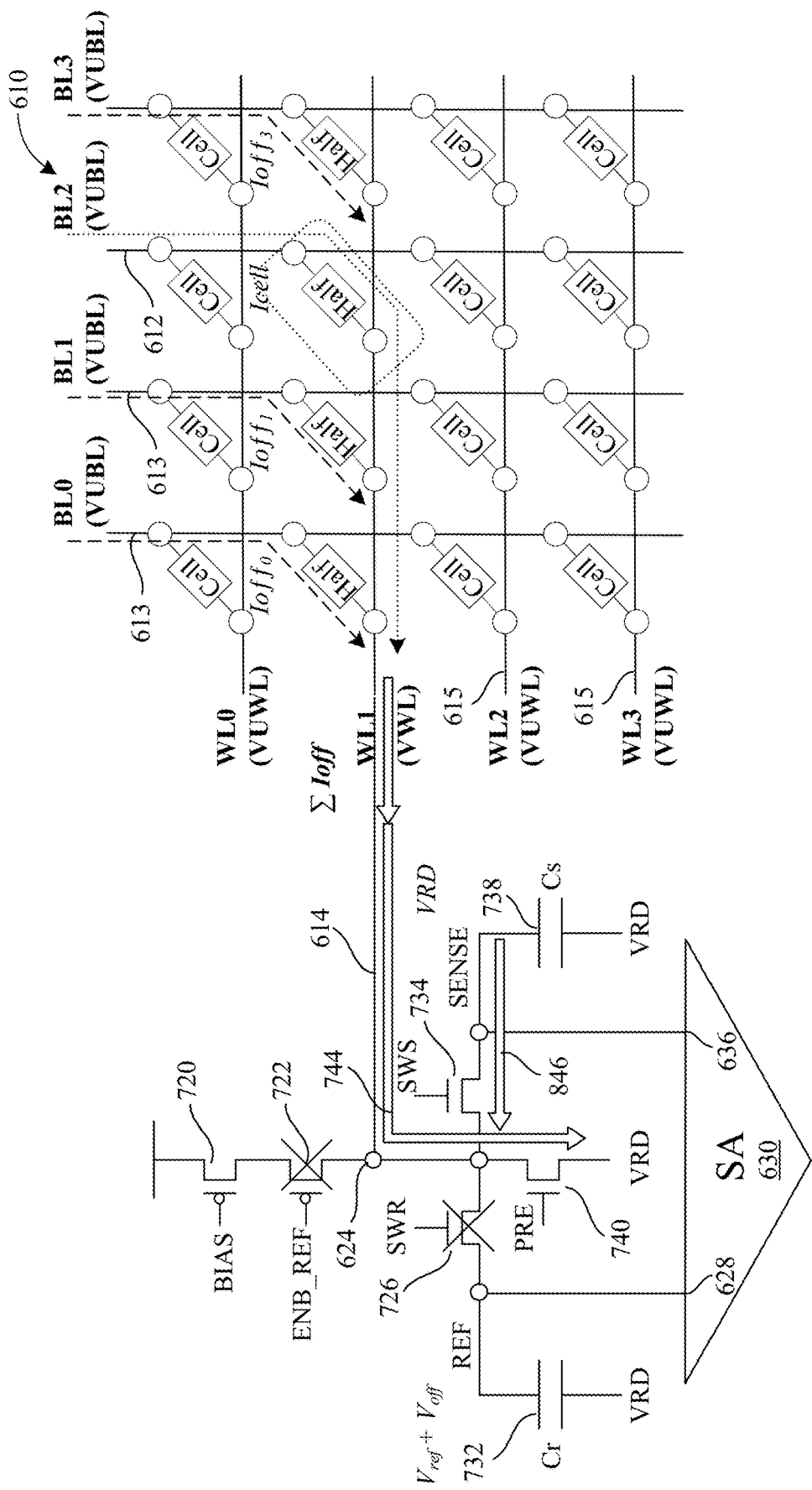
Figure 8B:
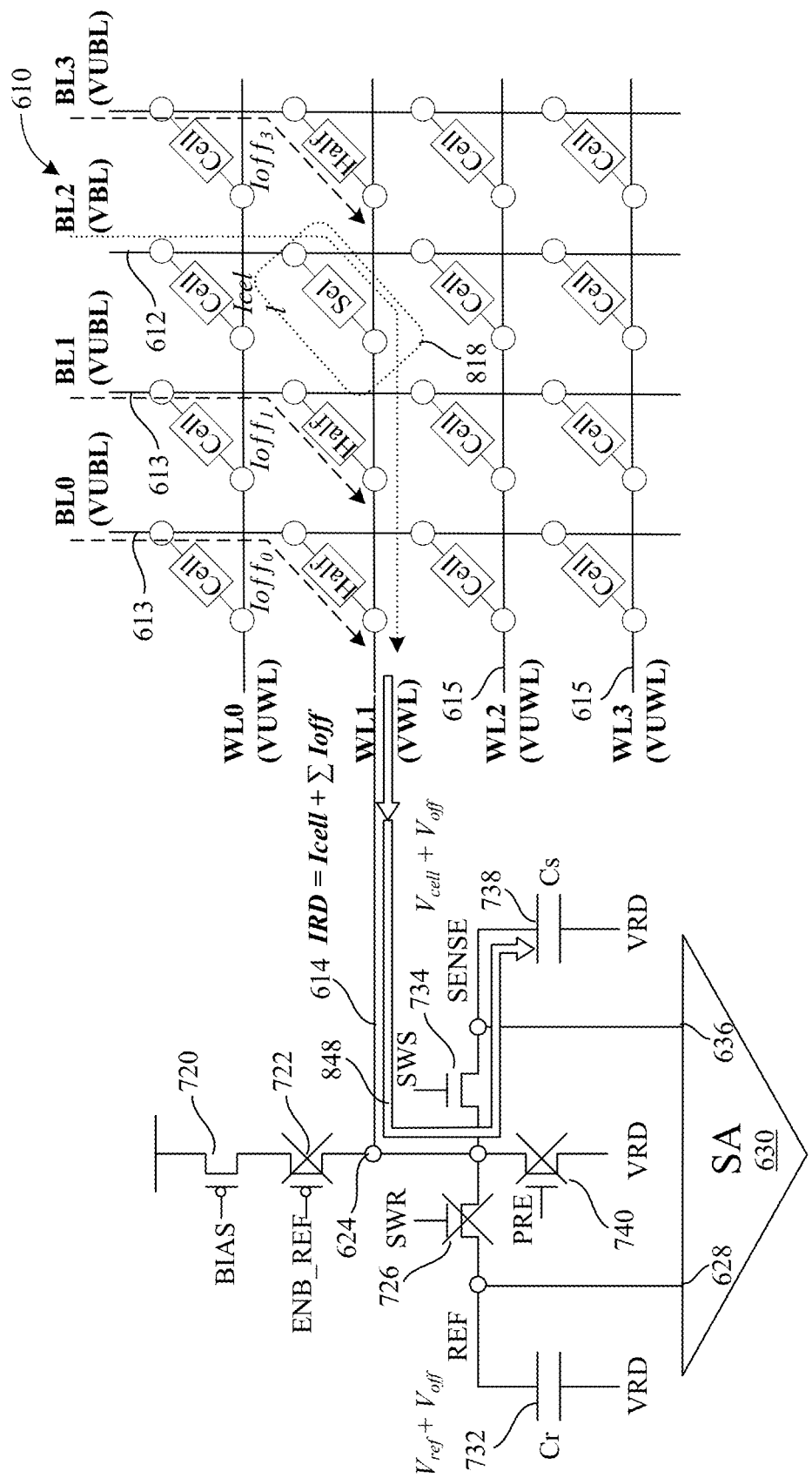

In the second read segment preset phase, preset paths are activated which establish VRD as an initial voltage at the Sense node 636 of the sense amplifier 630. As shown in FIG. 8a, this involves turning off transistors 722 and 726 and turning on transistors 734 and 740. VUBL remains applied to all of the bit lines 612, 613, and VUWL remains applied to all of the unselected word lines 115. As indicated by arrows 846, the resulting current flows force the voltage on capacitor 738 to VRD, as, again, is the voltage on the selected word line 614.

In the data capturing phase of the second read segment, the preset paths again are turned off and the selected bit line 612 is biased to the bit line read bias voltage VBL. VUBL remains applied to all of the unselected bit lines 613. Transistors 722, 726 and 740 are all turned off and transistor 734 is turned on, allowing the actual read current IRD to charge up capacitor 738. Because VBL is now applied to the selected bit line 612, IRD is largely determined by the logic state in the target memory cell 818, except for the contributions from the current flowing through each of the half-selected memory cells sharing word line 614. Thus IRD=Icell+ΣIoff, and the resulting voltage established on the sense node 636 of sense amplifier 630 is Vcell+Voff.

Figure 9:
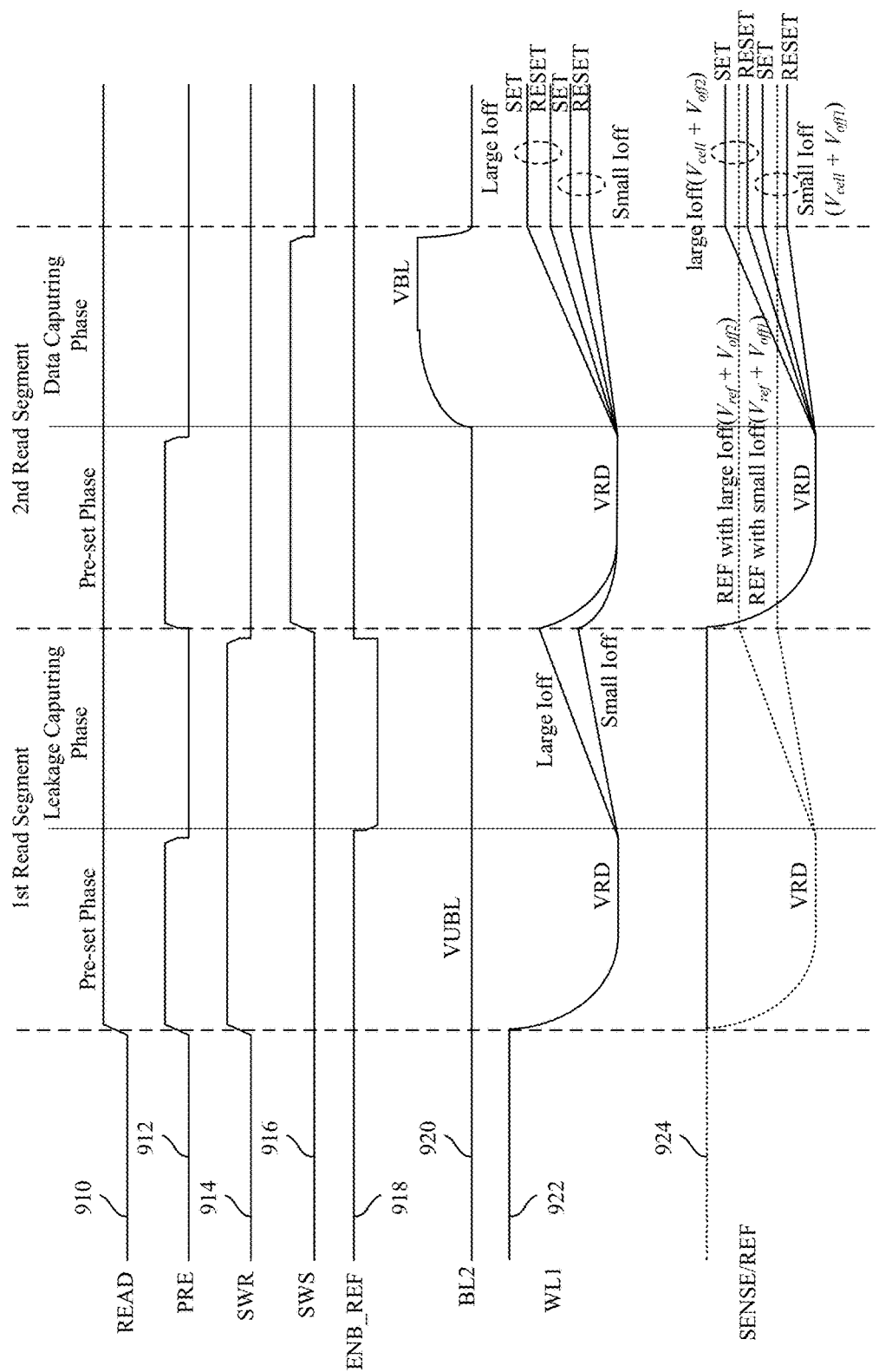
FIGS. 9, 14a and 14b are timing diagrams of voltages and control signals during read operations incorporating aspects of the invention.

The control signals PRE, SWR, SWS and ENB REF are indicated in FIGS. 7a, 7b, 8a and 8b. FIG. 9 is a timing diagram illustrating how the voltage of these signals and others change during the read operation just described. As illustrated in FIG. 9, the overall read operation includes a first read segment followed by a second read segment. The first read segment includes a preset phase followed by a leakage capturing phase, and the second read segment includes a preset phase followed by a data capturing phase. As illustrated by line 910, the entire read operation is begun by raising a READ signal from low to high. As indicated by line 912, a PRE signal enables transistor 740 during both preset phases, and disables it during the leakage capturing phase and the data capturing phase. As indicate by line 914, an SWR signal activates the reference current path by enabling transistor 726 during the first read segment but not during the second read segment. Conversely, as indicated by line 916, an SWS signal activates the sense current path by enabling transistor 734 during the second read segment but not during the first read segment. an ENB_REF signal, line 918, enables Iref to reach current summing node 624 only during the leakage capturing phase of the first read segment by bringing the gate of P-channel transistor 722 low only during that phase. The voltage on the selected bit line 612 remains at VUBL for the first three phases, and rises to VBL only during the data capturing phase (line 920), and the resulting voltage curves on the selected word line 614 are illustrated in line 922.

Line 922 illustrates four cases: Large Ioff with target cell in the Set state; Large Ioff with target cell in the Reset state; Small Ioff with target cell in the Set state, and Small Ioff with target cell in the Reset state. In all four cases the voltage on the selected word line 614 is brought down to VRD during the preset phase of the first read segment. In the leakage capturing phase, this voltage increases to a larger value Vref+Voff2 in the large Ioff case, or a smaller value Vref+Voff1 in the small Ioff case. This is the leakage tracked reference voltage $V_{REF\_LT}$, and it is captured by capacitor 732 when SWR turns off transistor 726. Then in the second segment the preset phase again brings the voltage on the selected word line 614 down to VRD. Then in the data capturing phase the voltage increases to a value which depends on both the state of the target memory cell and the value of Ioff. From top to bottom as shown in FIG. 9, in the case of large Ioff with target cell in the Set state, the voltage is highest. Next highest is the case of large Ioff with target cell in the Reset state. Next is the case of small Ioff with target cell in the Set state, and lowest is the case of small Ioff with the target cell in the Reset state.

At the end of the data capturing phase the sense amplifier 630 compares the captured sensed voltage (at sense node 636) to the leakage tracking reference voltage (at reference node 628) captured at the end of the leakage capturing phase. Line 924 in FIG. 9 illustrates the two signals superimposed on each other, with the captured sensed voltage in solid line and the leakage tracking reference voltage in broken line. In the first read segment the broken line is a copy of the line 922. In the second read segment the broken line remains at the fixed (captured) leakage tracking reference voltage while the solid line is a copy of line 922. It can be seen that at the end of the second read segment, the leakage tracking reference voltage is roughly mid-way between the read voltages that would been sensed for the Set and Reset states of the target memory cell, and this is true for both the large and small Ioff cases. In fact it would be true for any likely value of Ioff. Thus the ability to distinguish the logic state of the target memory cell is preserved regardless of the number of other cells sharing the selected word line that are in one state or the other.

It is noted that in embodiments described above, the currents that are detected are those present on a word line of the array. In other embodiments current can be detected on bit lines of the array. Because of this interchangeability, the bit lines and word lines are sometimes referred to herein more generally as "primary access lines" and "secondary access lines". In one embodiment the primary access lines are bit lines and the secondary access lines are word lines, whereas in another embodiment the primary access lines are word lines and the secondary access lines are bit lines. The terms "primary" and "secondary" here should be seen as mere labels, and do not imply any form of primacy of one access line over the other.

Alternative Embodiment: Use of Reference Memory Array

In FIGS. 7a, 7b, 8a and 8b, the reference current Iref is provided by a biased P-channel transistor 720 to Vcc. Other types of current sources are well known and can be substituted for the single transistor 720. In other embodiments, the reference current can be provided by other mechanisms. In one such alternative embodiment, the reference current is provided through a reference memory array rather than by a separate reference current source 620. The reference memory array can share all the same word lines as the primary memory array.

Figure 2:
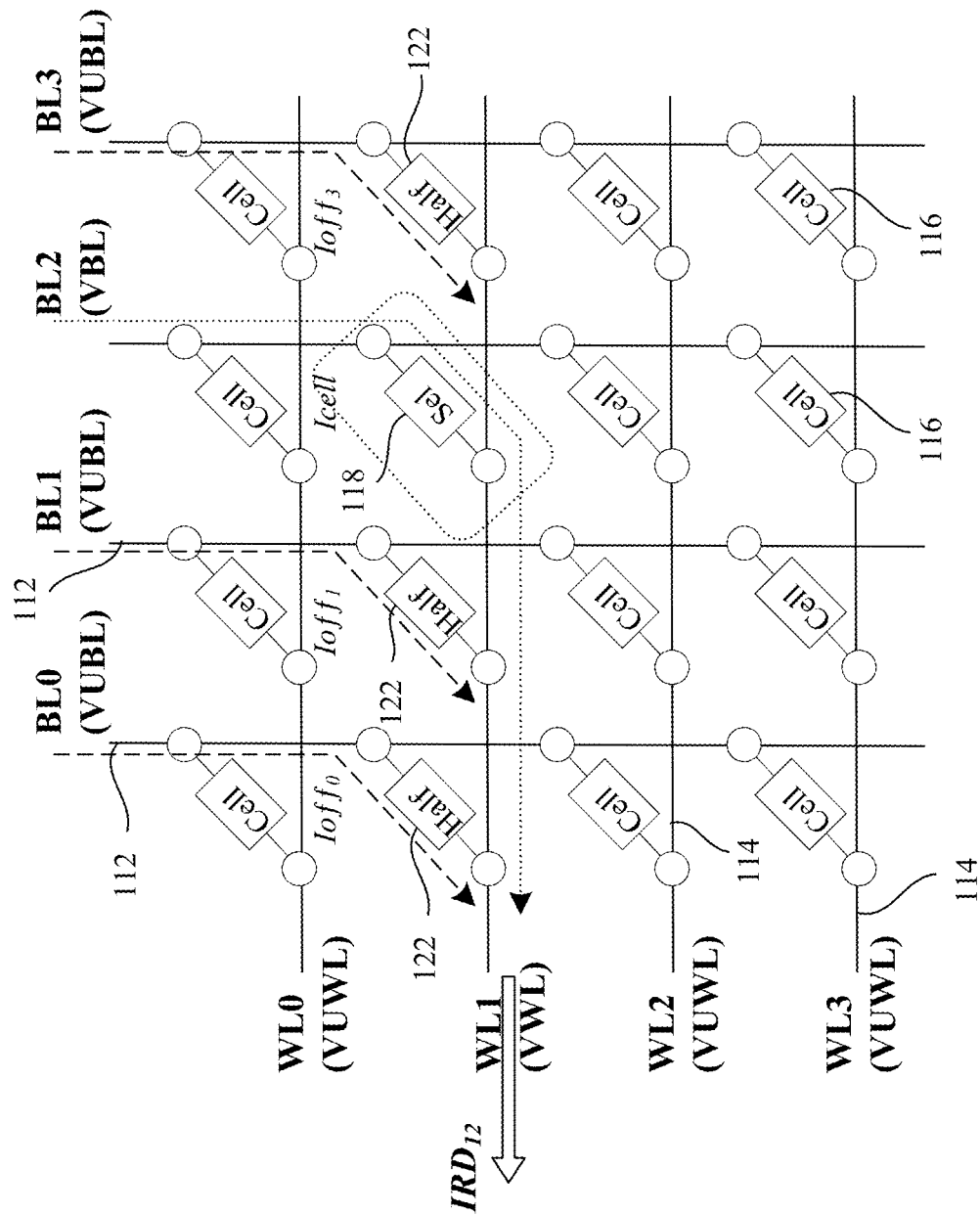
FIG. 2 is the schematic diagram of FIG. 1B, with labels added.
Figure 11:
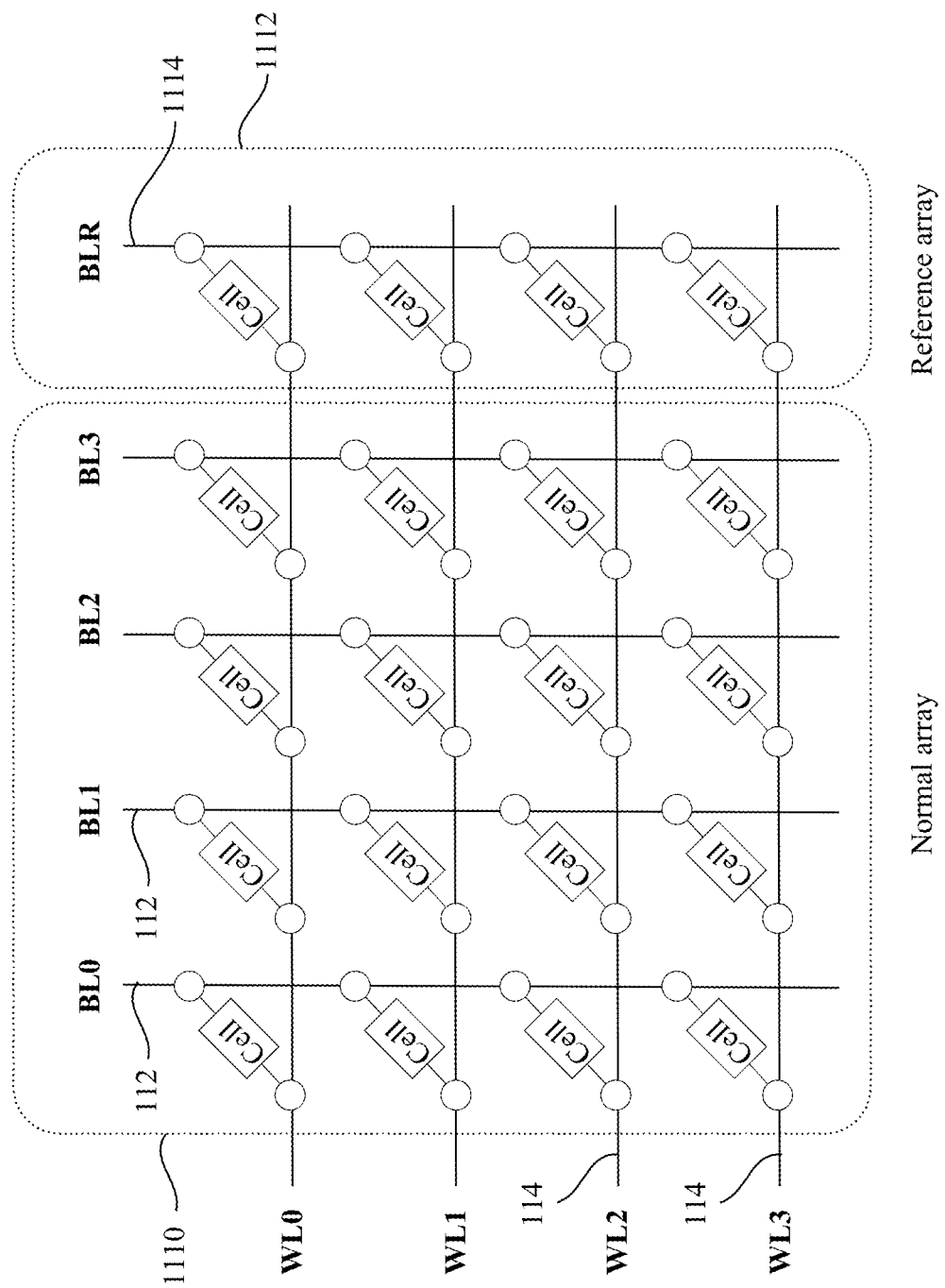
FIG. 11 illustrates a dual array structure for providing reference currents.

FIG. 11 illustrates the dual array structure of this alternative embodiment. It includes a primary array 1110 which is much the same as the memory array of FIG. 2, and a reference memory array 1112. The reference memory array 1112 includes only a single column of memory cells, sharing a single reference bit line BLR 1114. Each of the memory cells in the reference memory array 1112 shares a respective word line with a corresponding row of memory cells in the primary memory array. Preferably the reference cells are in a resistance state that is roughly mid-way between the set and reset states.

Figure 12A:
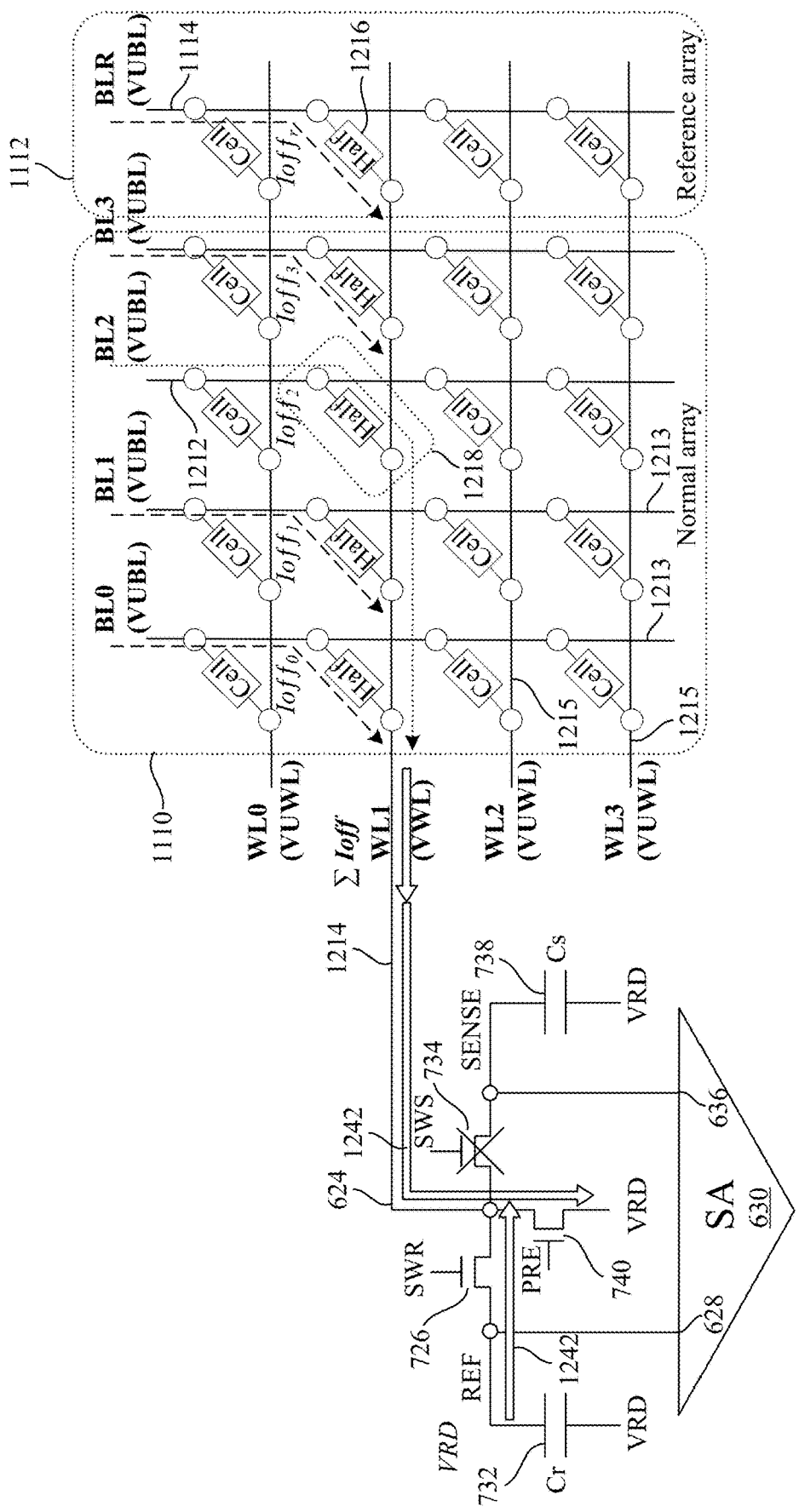
FIGS. 12a and 12b (collectively FIGS. 12), and 13a and 13b (collectively FIG. 13) illustrate operation of the dual array structure of FIG. 11 for a read operation incorporating aspects of the invention.
Figure 12B:
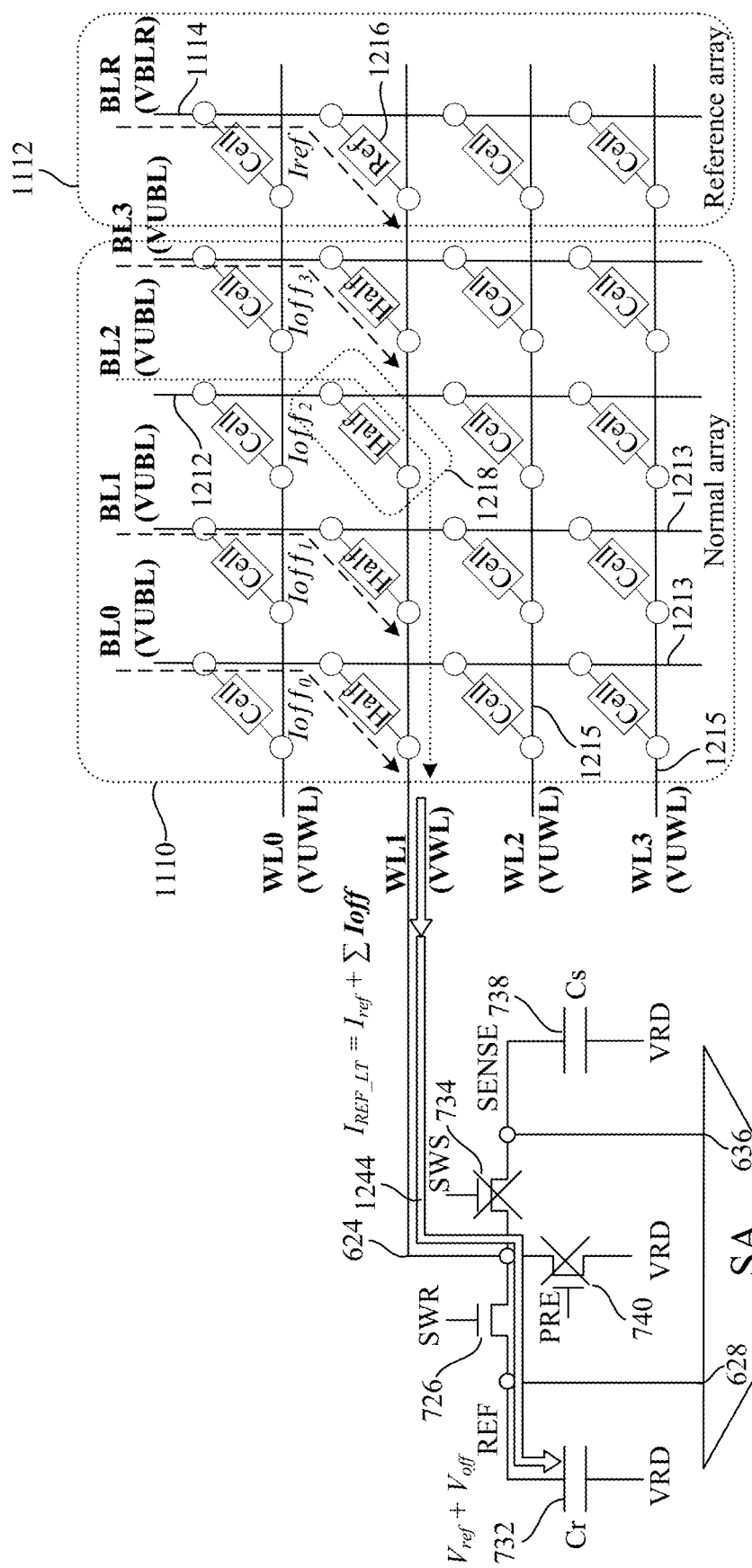
Figure 13A:
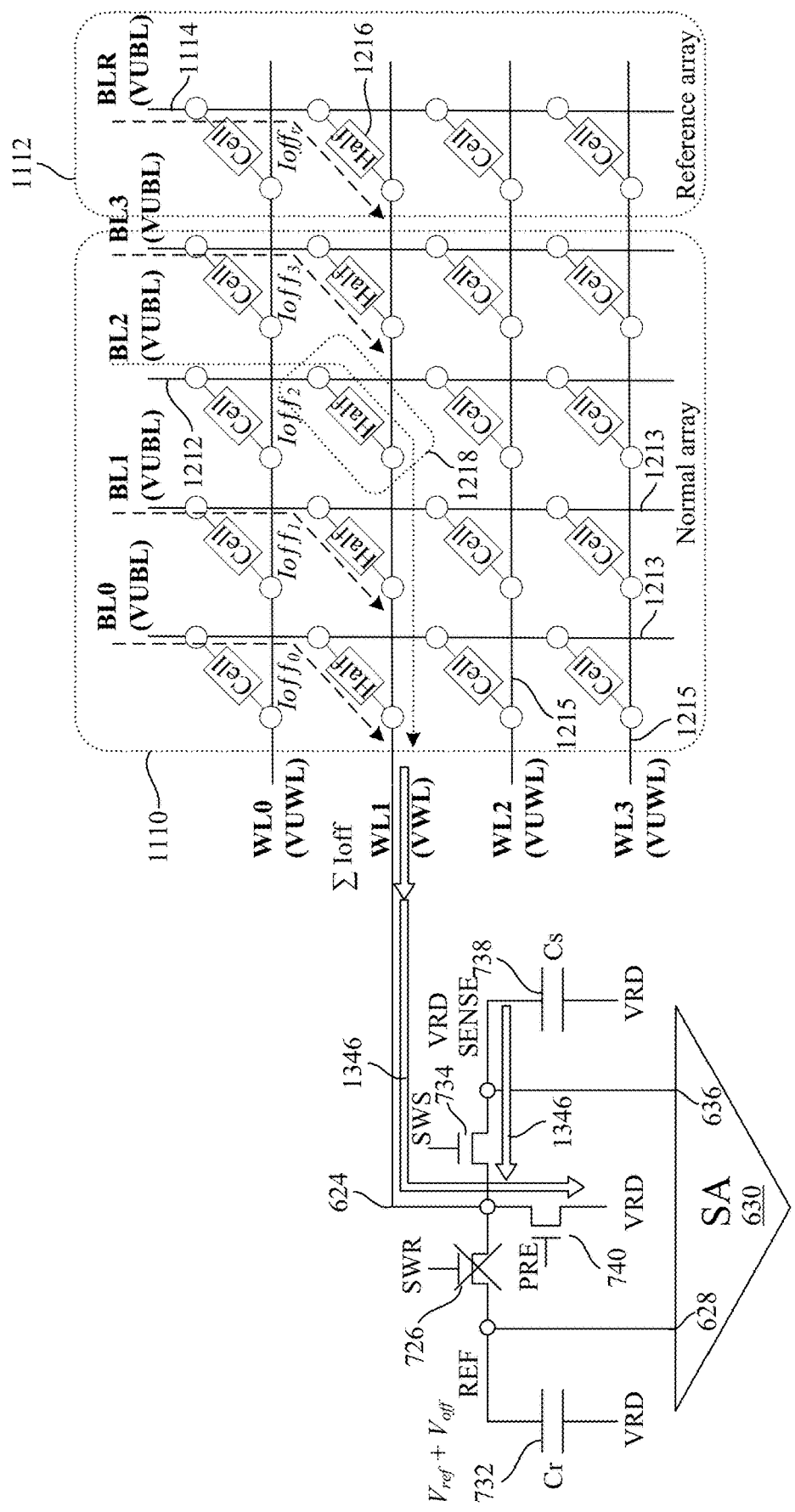
Figure 13B:
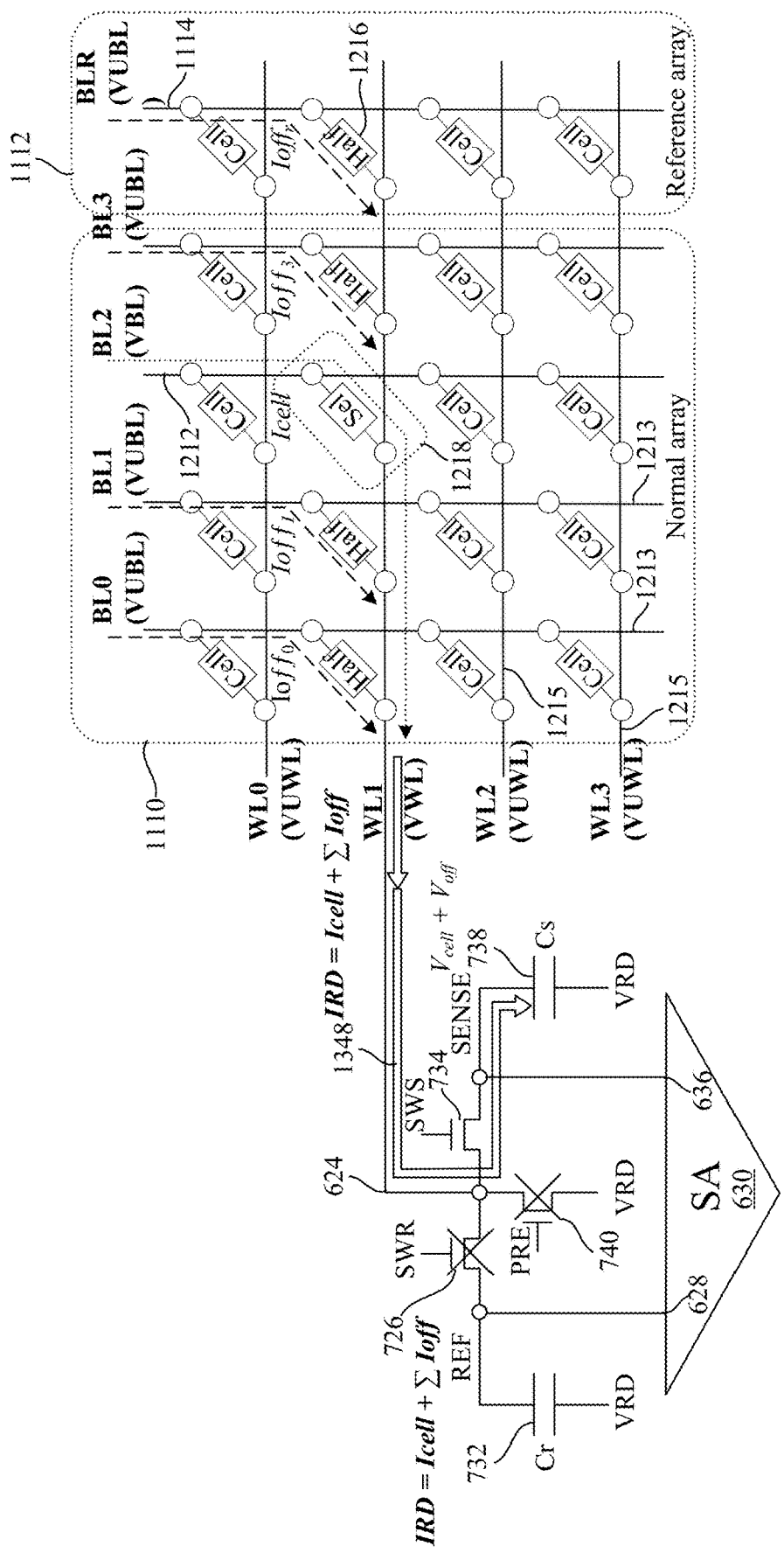

FIGS. 12a, 12b, 13a and 13b illustrate the operation of this alternative embodiment. In operation, the first read segment preset phase is illustrated in FIG. 12a. In this phase, the preset paths are activated which establish VRD as an initial voltage at the Reference node 628 of the sense amplifier 630. This is accomplished by applying VUBL to all of the bit lines 1212, 1213, applying VUWL to all of the unselected word lines 1215, turning on transistors 726 and 740, and turning off transistor 734. VUBL is also applied to the reference bit line 1114. Thus with current flows indicated by arrows 742, the voltage on capacitor 732 is forced to VRD, as is the voltage on the selected word line 614.

In the leakage capturing phase of the first read segment (FIG. 12b), the preset paths are turned off and a reference path is turned on. This involves turning off transistor 740 and leaving transistor 734 in the off state. Transistor 726 remains on. VUBL remains applied to all of the bit lines 1212, 1213 in the primary array, and VUWL remains applied to all of the unselected word lines 115. But now the voltage on the reference bit line 1114 is pulled up to a voltage VBLR. VBLR may be the same as VBL. A current (Iref) therefore flows from the reference bit line 1114, through the reference memory cell 1216 that shares the selected word line, and adds to the current flowing out from the selected word line into the summing node 624. As indicated by arrow 1244, the resulting current flow of Iref+ΣIoff charges capacitor 732 to voltage Vref+Voff, which is a leakage tracking reference bias $V_{REF\_LT}$.

In a second read segment preset phase (FIG. 13a), preset paths are activated which establish VRD as an initial voltage at the Sense node 636 of the sense amplifier 630. This involves turning off transistor 726 and turning on transistors 734 and 740. VUBL remains applied to all of the bit lines 1212, 1213 of the primary array 1110, and is also applied to the reference array bit line 1114. VUWL remains applied to all of the unselected word lines 115. As indicated by arrows 1346, the resulting current flows force the voltage on capacitor 738 to VRD, as, again, is the voltage on the selected word line 1214.

In the data capturing phase of the second read segment (FIG. 13b), the preset paths again are turned off and the selected bit line 1212 is biased to the bit line read bias voltage VBL. VUBL remains applied to all of the unselected bit lines 1213 of the primary array 1110, and also to the reference bit line 1114 of the reference array 1112. Transistors 726 and 740 are both turned off and transistor 734 is turned on, allowing the actual read current IRD to charge up capacitor 738. Because VBL is now applied to the selected bit line 1212, IRD is largely determined by the logic state in the target memory cell 1218, except for the contributions from the current flowing through each of the half-selected memory cells sharing word line 1214, including the half-selected reference cell 1216. Thus IRD=Icell+ΣIoff, and the resulting voltage established on the sense node 636 of sense amplifier 630 is Vcell+Voff.

Relative to the embodiment of FIGS. 7a, 7b, 8a and 8b, the embodiment of FIG. 11 offers the advantage that the behavior of the reference cell will be similar to that of a normal array. On the other hand, the embodiment of FIG. 11 involves a larger layout area, as well as difficulties in trimming the large number of reference cells.

Figure 14A:
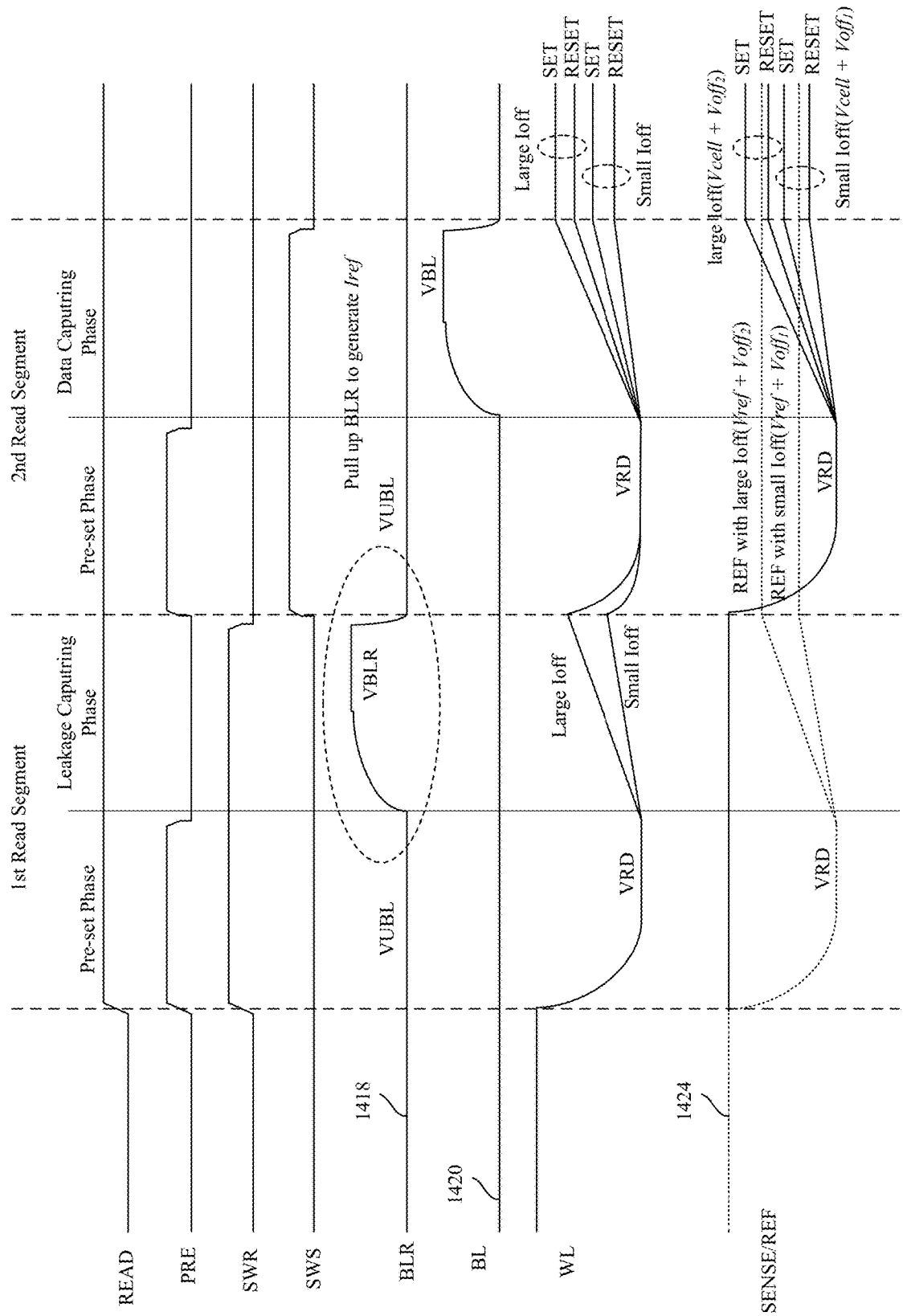

FIG. 14a is a timing diagram illustrating how the voltage of signals change during the read operation just described. The lines shown are the same as in FIG. 9, except that line 918, which represented the enable signal for transistor 722, has been replaced by line 1418, which represents the voltage applied to the reference bit line 1114 of the reference array 1112. It can be seen that this voltage starts out low (at VUBL), and rises to VBLR only during the leakage capturing phase of the first read segment. Then it returns low to VUBL for the remainder of the read operation. It can be seen further from line 1424, showing captured sensed voltage (at sense node 636) superimposed on the leakage tracking reference voltage (at reference node 628) captured at the end of the leakage capturing phase, that as with the embodiment of FIGS. 6a, 6b, 7a and 7b, the ability to distinguish the logic state of the target memory cell 1218 is preserved regardless of the number of other cells sharing the selected word line that are in one state or the other.

Figure 14B:
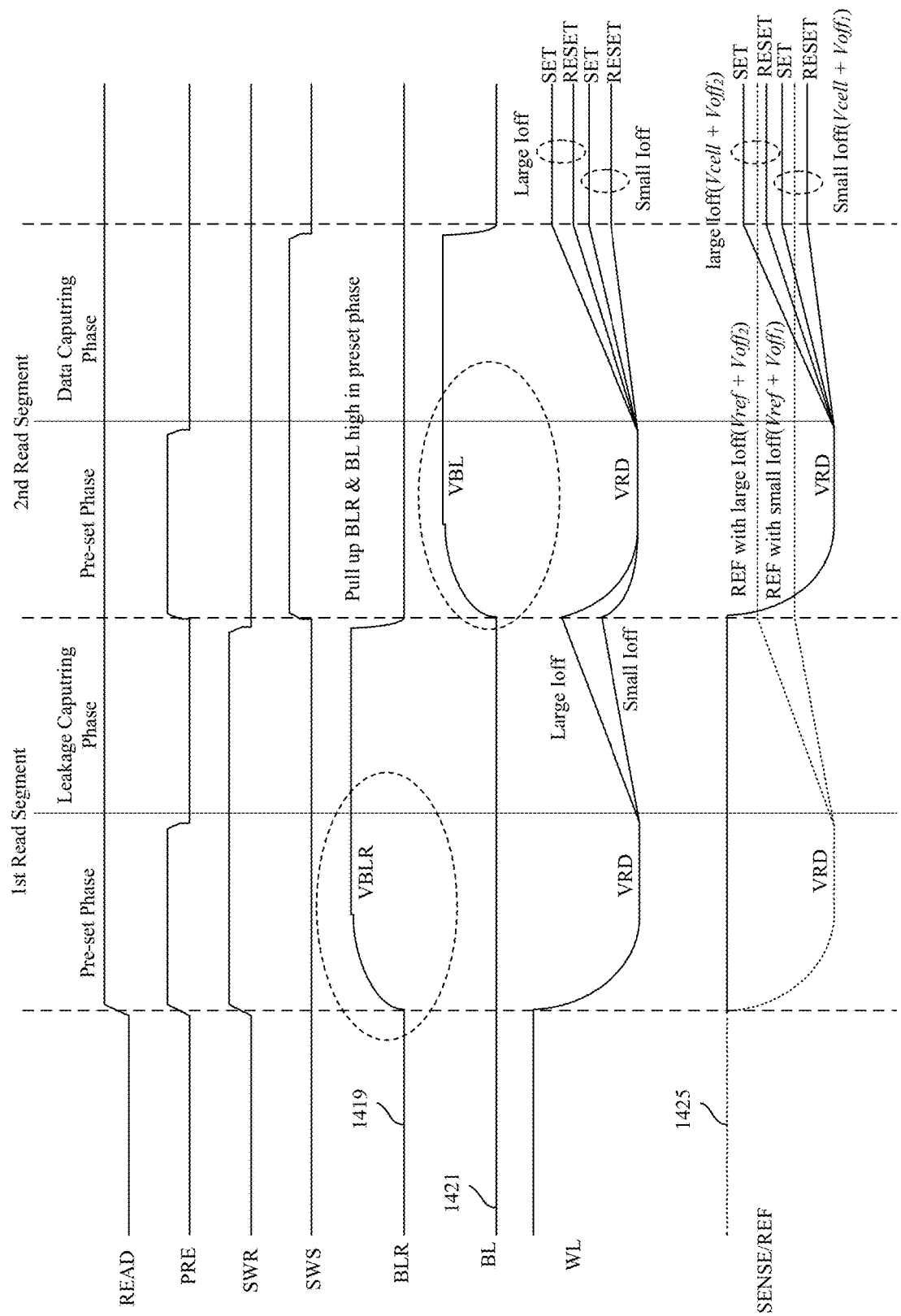

FIG. 14b is another timing diagram illustrating a variation of the FIG. 14a timing diagram. The lines shown are the same as in FIG. 14a, except that line 1418, which represents the voltage applied to the reference bit line 1114 of the reference array 1112, has been replaced by a line 1419. Also in FIG. 14b line 1420, which represents the voltage applied to the selected bit line 1212, has been replaced by a line 1421. It can be seen that the operation of the embodiment according to FIG. 14b differs from that of FIG. 14a in that in FIG. 14b, the voltage on the reference bit line 1114 increases to VBLR earlier than in FIG. 14a. Instead of rising only during the leakage capturing phase of the first read segment, it rises during the preset phase of the first read segment and remains at VBLR until the end of the first read segment. Similarly, in FIG. 14b, the voltage on the selected bit line 1212 increases to VBL earlier than in FIG. 14a. Instead of rising only during the data capturing phase of the second read segment, it rises during the preset phase of the second read segment and remains at VBL until the end of the read operation. The FIG. 14b embodiment can speed up read operation relative to the FIG. 14a embodiment by reducing the time required to capture leakage and data. On the other hand, the FIG. 14b embodiment produces more stress on the cell because the high voltage bias is applied for a longer period of time in each read operation. This can increase the risk of read disturb. Again, as with the embodiment of FIGS. 6a, 6b, 7a and 7b, the ability to distinguish the logic state of the target memory cell 1218 is preserved regardless of the number of other cells sharing the selected word line that are in one state or the other.

Figure 16:
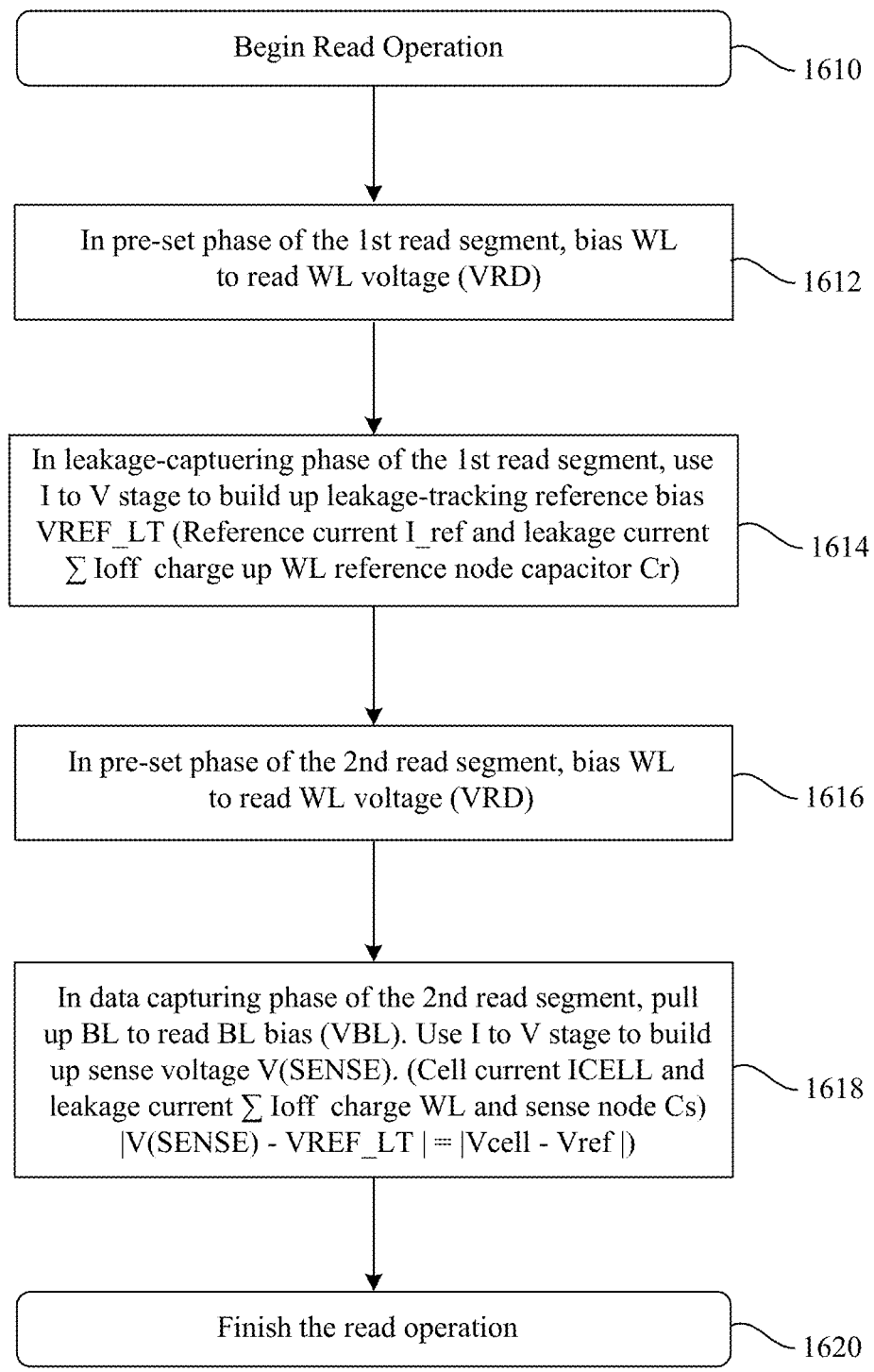

FIG. 16 is a flow chart, of which the timing diagrams of FIGS. 9, 14a and 14b are example expressions in signal form. In step 1610, the read operation begins. In step 1612, a first read segment preset phase occurs in which the selected word line is biased to the read voltage VRD. In step 1614, a leakage-capturing phase of the first read segment occurs. An I-to-V stage is used to build up a leakage-tracking reference bias $V_{REF\_LT}$ by using the reference current Iref and the leakage current ρIoff to charge up both the word line and the reference node capacitor Cr. In one embodiment, the reference current Iref is generated by a current mirror circuit, whereas in another embodiment, it is generated by a reference array which shares same word line (WL) with the primary array. In step 1616, a $2^{nd}$ read segment preset phase occurs in which the word line is biased to the read word line voltage VRD. In a data capturing phase of the second read segment, the selected bit line is pulled up to the bit line bias voltage VBL. The cell current $I_{CELL}$ and the leakage current ΣIoff will charge the word line and the sense node Cs to the sense voltage Vcell+Voff (step 1618). In step 1620 the read operation completes with the sense amplifier comparing the reference voltage on reference capacitor Cr with the sense voltage on sense capacitor Cs in order to determine the logic state of the target cell.

Re-Using The Leakage Tracking Reference Bias

Figure 15A:
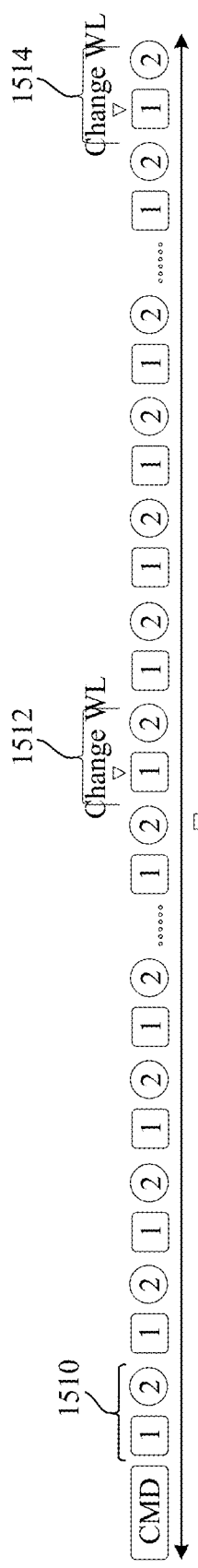
FIGS. 15a, 15b and 15c illustrate sequences of read operations.
Figure 15B:
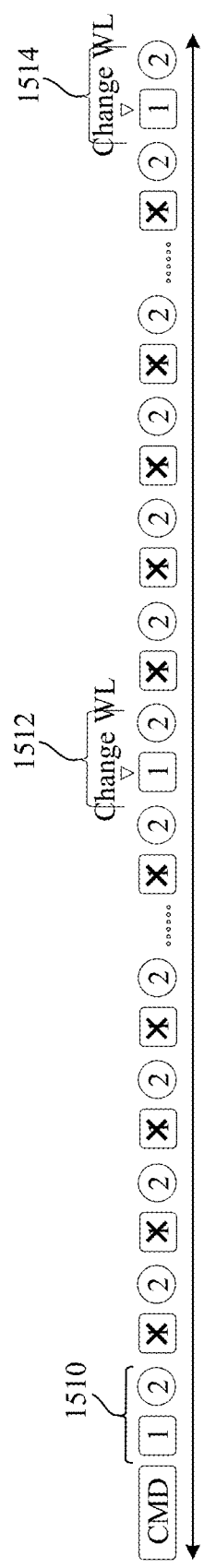
Figure 15C:
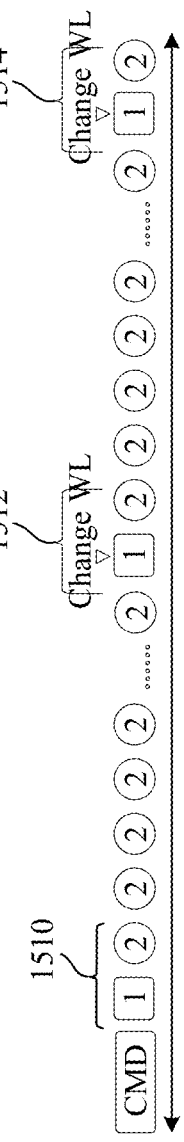

FIGS. 9, 14a and 14b each illustrate embodiments of an entire read operation, including both the first and second segments. In one embodiment, every read operation undergoes both the first and second segments. However, for two consecutive read operations, if the selected word line for the second read segment is the same as that for the first read segment, there is typically no need to repeat the first segment since the leakage current will not have changed. Thus the process of reading more than one memory cell sharing a single word line can be expedited by omitting the first read segment from each of the second and subsequent read operations. This is illustrated in FIGS. 15a, 15b and 15c. FIG. 15a illustrates an embodiment having a number of consecutive read operations. A '1' in a square indicates a first read segment and a '2' in a circle indicates a second read segment. Thus each '1-2' pair represents a full read operation. In the embodiment of FIG. 15a, after the first read segment 1510, the selected word line address does not change except for read operations 1512 and 1514. In this case it is not necessary to perform the first read segment for any of the read operations other than the read operations 1510, 1512 and 1514. FIG. 15b illustrates the omitted first read segments as an 'X' superimposed on the '1' in the square. The result is illustrated in FIG. 15c: a full read operation 1510 is followed by a number of second-segment-only read operations, followed by another full read operation 1512, followed by several more second-segment-only read operations, followed by another full read operation 1514. As can be seen in FIG. 15c, of the 26 read segments illustrated, only 16 include the first read segment.

If the value representing the leakage current is stored in capacitance, as it is in the embodiments of FIGS. 7a, 7b, 8a, 8b, 12a, 12b, 13a, and 13b, then there is a limit to the length of time that the stored value remains valid, due to leakage across the capacitor. Thus in one embodiment, the leakage value is refreshed at particular times by forcing a repeat of a first read segment, even where the word line address has not changed. A forced refresh due only to capacitance leakage typically will not occur in the first read operation following the read operation in which the leakage value was previously established, but rather might occur during the second or later consecutive read operation following the read operation in which the leakage value was previously established. In one embodiment, the control circuitry triggers a refresh after a predetermined time period (e.g. 100 μS), or after a predetermined number of consecutive second read segments. In another embodiment a Vref detector monitors the voltage on the reference capacitor and triggers a refresh if it falls below a predetermined minimum voltage Vmin. Preferably, Vmin can be chosen as the voltage at which the read operation has a significant likelihood of failing. In general, Vref should be between Vcell(set) and Vcell(reset) (i.e. Vcell(set)>Vref>Vcell(reset)). However if Vmin is lower than Voff+Vcell(reset), the reading of some "reset" cells will fail (i.e. will be read improperly as being in the "set" state). Therefore it is preferable that Vmin be chosen as being greater than or equal to Voff+Vcell(reset).

In general, a reference validity determination module 1038 can be provided which signals the controller 1034 whether or not to perform the first read segment of the current read operation. If the determination is that the most recently captured leakage reference value is still valid, then the first read segment is omitted and only the second read segment is performed in the current read operation. Otherwise, the first read segment is performed. In various embodiments the most recently captured leakage reference value is considered invalid if the current read operation addresses a memory cell that does not share the secondary access line with the first memory cell; or if more than a predetermined amount of time has passed since the most recently captured leakage reference value was captured; or if more than a predetermined number of read operations have been performed since the most recently captured leakage reference value was captured. Other criteria for determining validity or invalidity will be apparent to the reader. A given embodiment might monitor for more than one condition under which a refresh of the leakage reference value is needed or desired, and force the first read segment in any read operation in which any of the conditions occurs. An embodiment might also force a refresh for other reasons as well. Many variations will be apparent to the reader.

Figure 3:
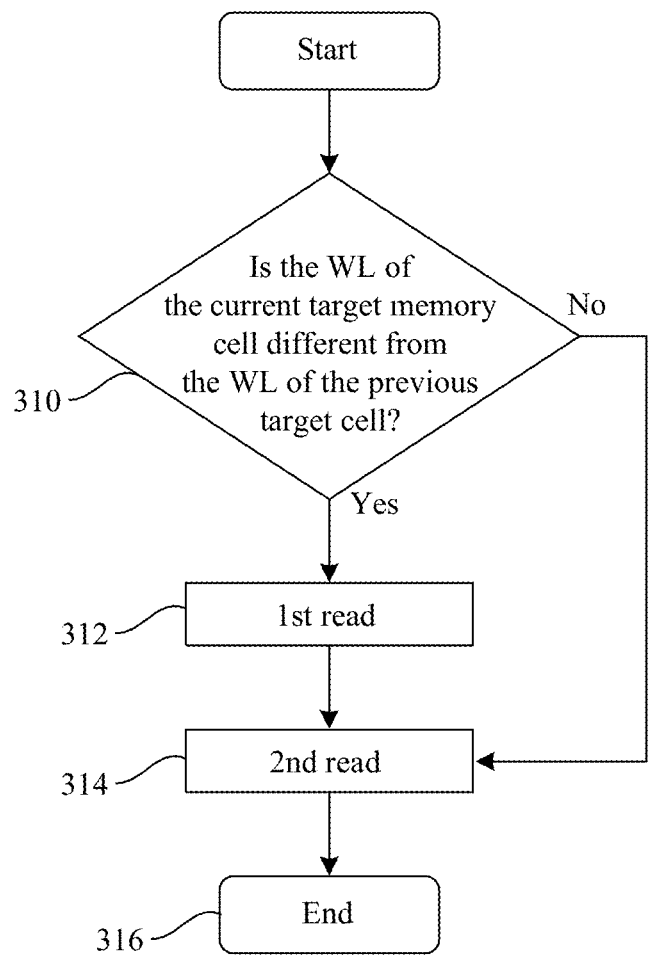
FIGS. 3, 4, 16 and 17 are flow charts illustrating operation of a crossbar memory array according to aspects of the invention.

FIG. 3 is an example flow chart in which the read speed for consecutive read operations is increased by omitting the first read segment if the target memory cell does not share a word line with the prior target memory cell. In step 310, the controller determines whether the word line of the current target memory cell differs from the word line of the previous target cell (i.e., the two target cells do not share a word line). Determining whether the word line of the current target memory cell differs from the word line of the previous target cell can be as simple as capturing the word line portion of the address in a register at each read, and at the time of the subsequent read operation, comparing the word line portion of the address of the current target cell to the previously captured word line address. If the two addresses differ, then the word line of the current target memory cell do not match; otherwise they do.

If the two word line addresses differ, then in step 312 the controller executes the first read segment of the current read operation, followed by the second read segment (step 314). If the two word line addresses match, on the other hand, then the controller skips step 312 and proceeds directly to step 314 to execute the second read segment of the current read operation. In step 316 the current read operation completes.

Figure 4:
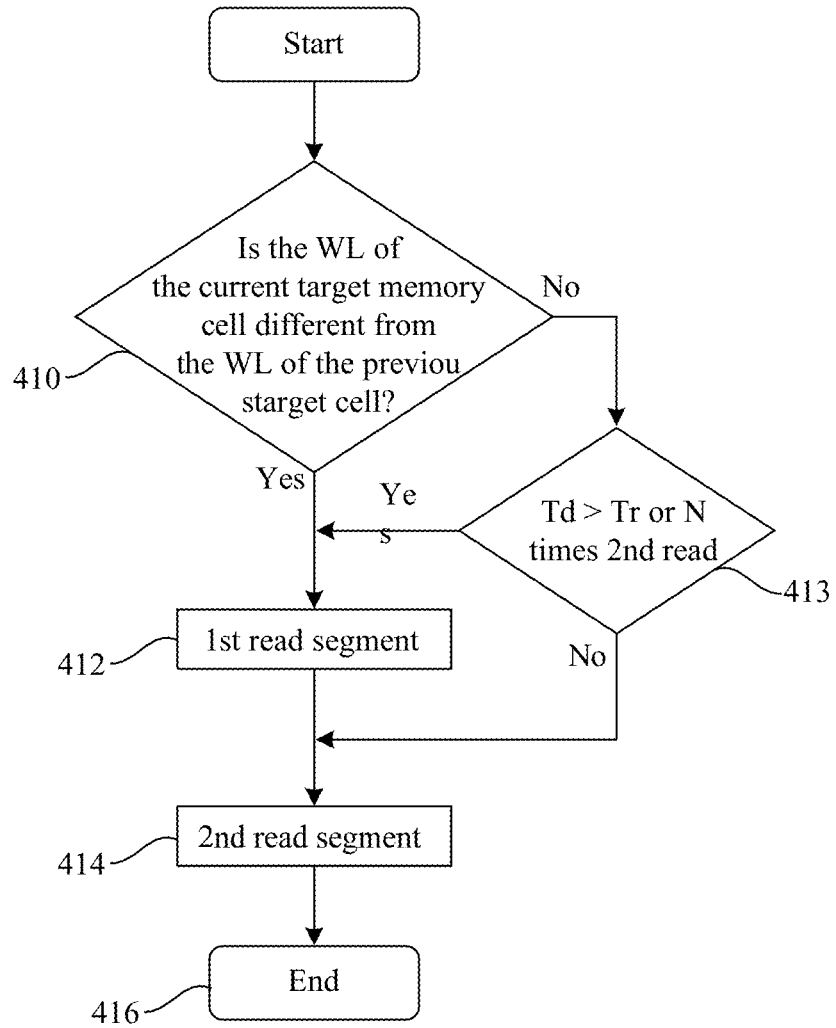

FIG. 4 is an example flow chart in which the read speed for consecutive read operations is increased by omitting the first read segment if the target memory cell does not share a word line with the prior target memory cell, but a refresh is forced anyway if too much time or too many consecutive read operations have elapsed since the most recent first read segment. In step 410, the controller determines whether the word line of the current target memory cell differs from the word line of the previous target cell. If the two word line addresses differ, then in step 412 the controller executes the first read segment of the current read operation. Then, in step 414, the controller executes the second read segment of the current read operation. The current read operation then completes (step 416). On the other hand, if in step 410 the controller determines that the word line of the current target memory cell is the same as the word line of the previous target cell, then in step 413 the controller determines whether it has been too long (either in time or number of second read segments performed) since the last time leakage current was captured. If so, then in this situation too, the controller executes both the first read segment 412 and the second read segment 414, and the current operation completes (step 416). If the controller determines in step 413 that it has not been too long since the last time leakage current was captured, then in this situation only, the controller skips the first read segment 412 and proceeds directly to the second read segment 414. Then in step 416 the current read operation completes.

Figure 17:
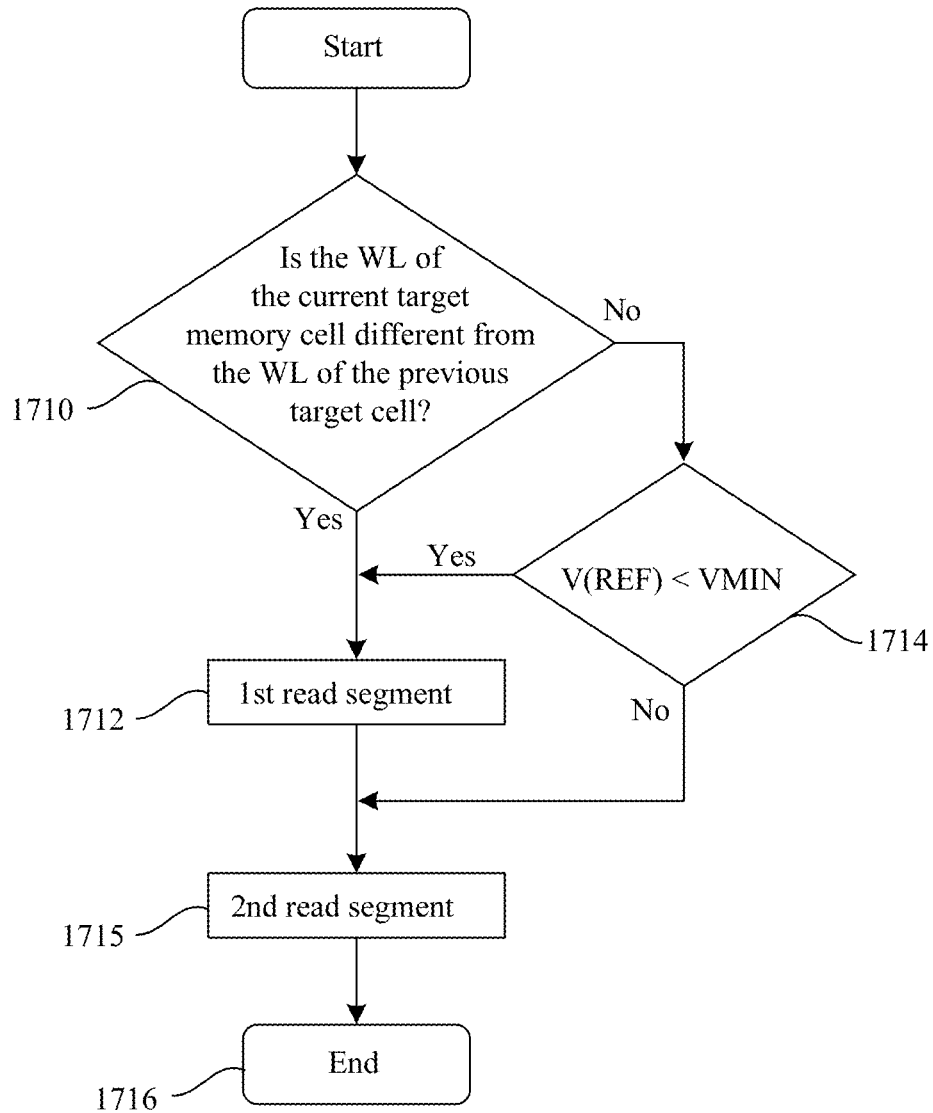

FIG. 17 is an example flow chart in which the read speed for consecutive read operations is increased by omitting the first read segment if the target memory cell does not share a word line with the prior target memory cell, but a refresh is forced anyway if the captured leakage tracking reference voltage has fallen to a level below a predetermined minimum. In step 1710, the controller determines whether the word line of the current target memory cell differs from the word line of the previous target cell. If the two word line addresses differ, then in step 1712 the controller executes the first read segment of the current read operation, and then proceeds to execute the second read segment of the current read operation in step 1715. The current operation then completes in step 1716. On the other hand, if in step 1710 the controller determines that the word line of the current target memory cell is the same as the word line of the previous target cell, then in step 1712 the controller determines whether the reference voltage (for example on reference capacitor 732) has, due to charge leakage across the capacitor, fallen to the point where it is below a predetermined minimum reference voltage Vmin. If so, then in this situation too, the controller executes both the first read segment 1712 and the second read segment 1715, and the current operation completes (step 1716). If the controller determines in step 1714 that the reference voltage has not fallen below the reference voltage Vmin, then in this situation only, the controller skips the first read segment 1712 and proceeds directly to the second read segment 1715. Then in step 1716 the current read operation completes.

Application to Write Operations

Many of the above concepts can be applied also to memory write operations, because the Ioff data dependency of the leakage current also affects the write current.

Figure 18:
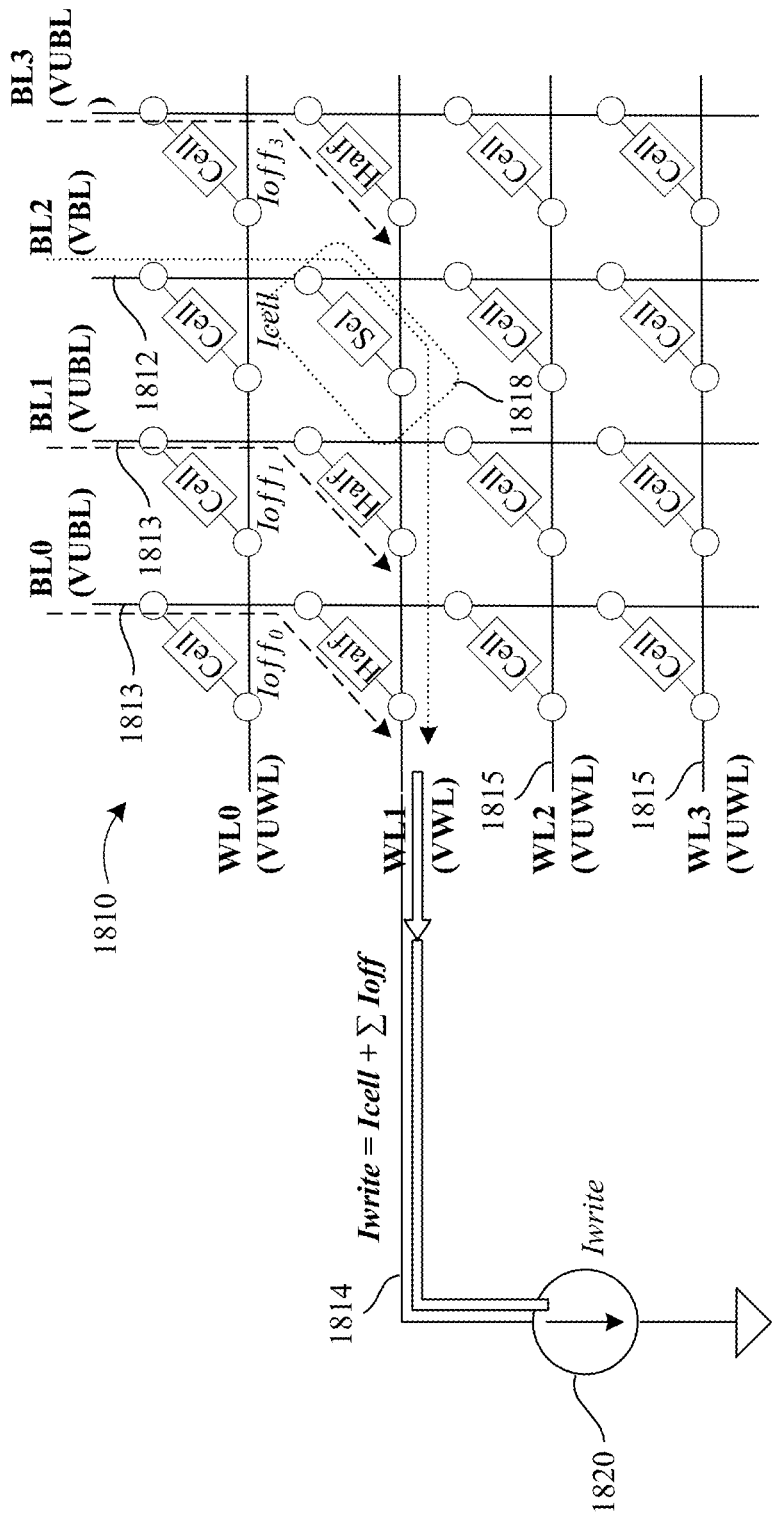
FIG. 18 is a schematic diagram of a crossbar memory array section with a write current generator.

FIG. 18 symbolically illustrates a structure for writing to a selected target cell 1818. Conventionally, a selected bit line voltage VBL is applied to the selected bit line 1812, a non-selected bit line voltage VUBL is applied to all the other bit lines 1813 in the array, a selected word line voltage VWL is applied to the selected word line 1814, a non-selected word line voltage VUWL is applied to all the other word lines 1815 in the array, and the selected word line 1814 is connected to a write current source 1820. The current source 1820 draws a write current Iwrite from the selected word line 1814, which is calculated to write a predetermined value into the target cell 1818. As an example, assume the desired write current is Iwrite=100 µA. However, some of the current on word line 1814 is drawn from other bit lines in the array, through the half-selected memory cells that share word line 1814 with the target cell. These undesired current flows are leakage currents, similar to the leakage currents arising in the context of read operations described above. If the leakage current amounts to 30 µA, for example, then the current flow through the target cell will be only 100 µA−30 µA=70 µA, which may not be sufficient to reliably write the desired logic value into the target cell. One might consider increasing the write current drawn by the current source 1820, but as in the context of read operations, the leakage current for any particular write operation depends on the logic values then stored in the half-selected memory cells, because different stored logic values present as different resistance values.

As in the context of read operations, the data dependency problem can be mitigated by adjusting the current drawn from the selected word line in dependence upon the number of memory cells sharing the selected word line which are in the first logic state and a number of memory cells sharing the selected word line which are in the second logic state. More specifically, a structure illustrated symbolically in FIGS. 19*a* and 19*b* can be used. The structure includes a leakage current collector 1932 and a write current generator 1920, which may be a current source such as 1820. The selected word line 1814 is connectable to the leakage current collector 1932 through a LEAK switch 1926, and is connectable to the write current generator 1920 through a WR switch 1934.

In operation, a "double write operation" is performed, that is a write operation that includes first and second segments. In the first segment, illustrated in FIG. 19*a*, the non-selection bit line voltage VUBL is applied to all the bit lines 1812, 1813; the selection word line voltage VWL is applied to the selected word line 1814, and the non-selection word line voltage VUWL is applied to all the other word lines 1815 in the array. The LEAK switch 1926 is closed (conducting), and the WR switch 1934 is open (non-conducting). The current output on the selected word line 1814 is then equal to the leakage current, which is captured and stored in the leakage current collector 1932. Next, in the second segment of the write operation, illustrated in FIG. 19*b*, the selection bit line voltage VBL is applied to the selected bit line 1812, the non-selection bit line voltage VUBL is applied to all the other bit lines 1813 in the array; the selection word line voltage VWL is applied to the selected word line 1814, and the non-selection word line voltage VUWL is applied to all the other word lines 1815 in the array. The LEAK switch 1926 remains closed (conducting), and the WR switch 1934 is now closed (conducting) as well. The write current generator 1920 now draws the desired write current from the word line 1814 (100 µA in the example above), but the leakage current collector 1932 now draws an additional amount of current from word line 1814 as previously registered in the first segment of the write operation (30 µA in the example above). Thus the total current draw from word line 1814 is 100 µA+30 µA=130 µA, sufficient to compensate for the amount of write current that leaks through the half-selected cells sharing word line 1814 and drawing the desired 100 µA through the target cell 1818. As can be seen, the current Icell drawn through the selected cell in the second segment will be equal to Iwrite+Ileak_collect−Ileak, where Iwrite is the current drawn on word line 1814 by the write current generator 1920, Ileak collect is the current drawn by the leakage current collector 1932, and Ileak is the leakage current drawn through all of the half-selected cells that share the same word line 1814. Since Ileak=Ileak_collect, the current drawn through the selected cell in the second segment will be equal to Iwrite, as desired. Thus the write current for writing the selected cell is not affected by the leakage current.

Figure 19B:
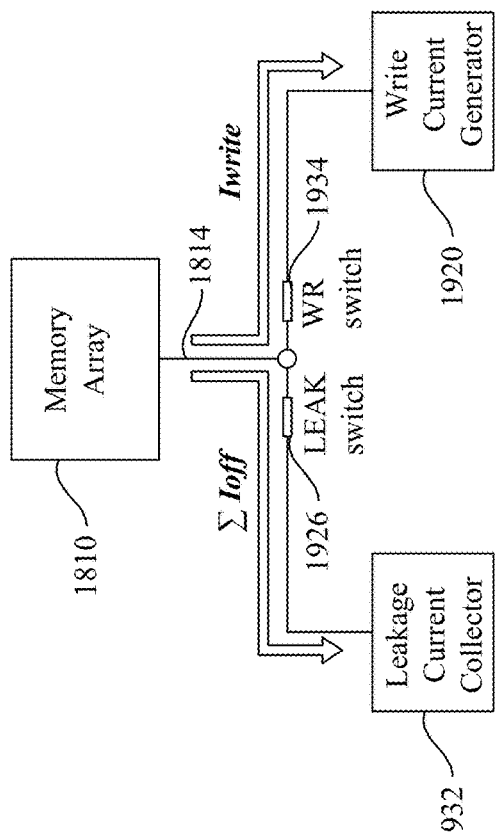
FIGS. 19a and 19b (collectively FIG. 19) are block diagrams of an arrangement which takes leakage current into account in a write operation.
Figure 19A:
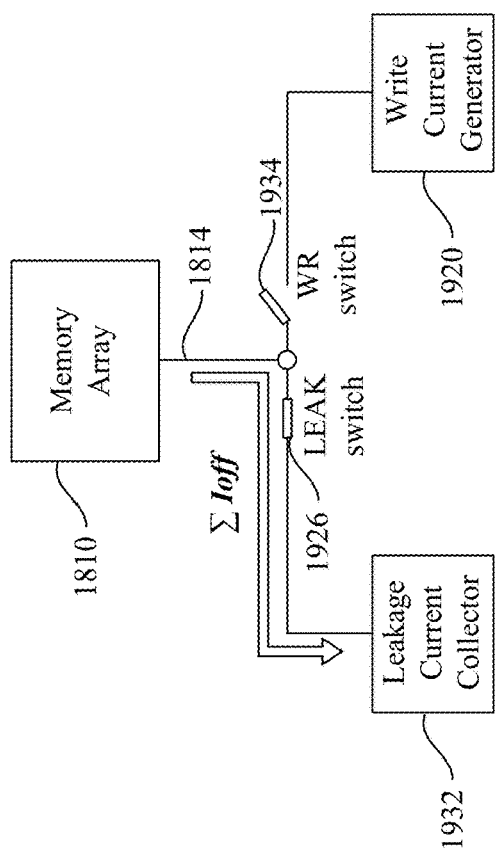
Figure 20A:
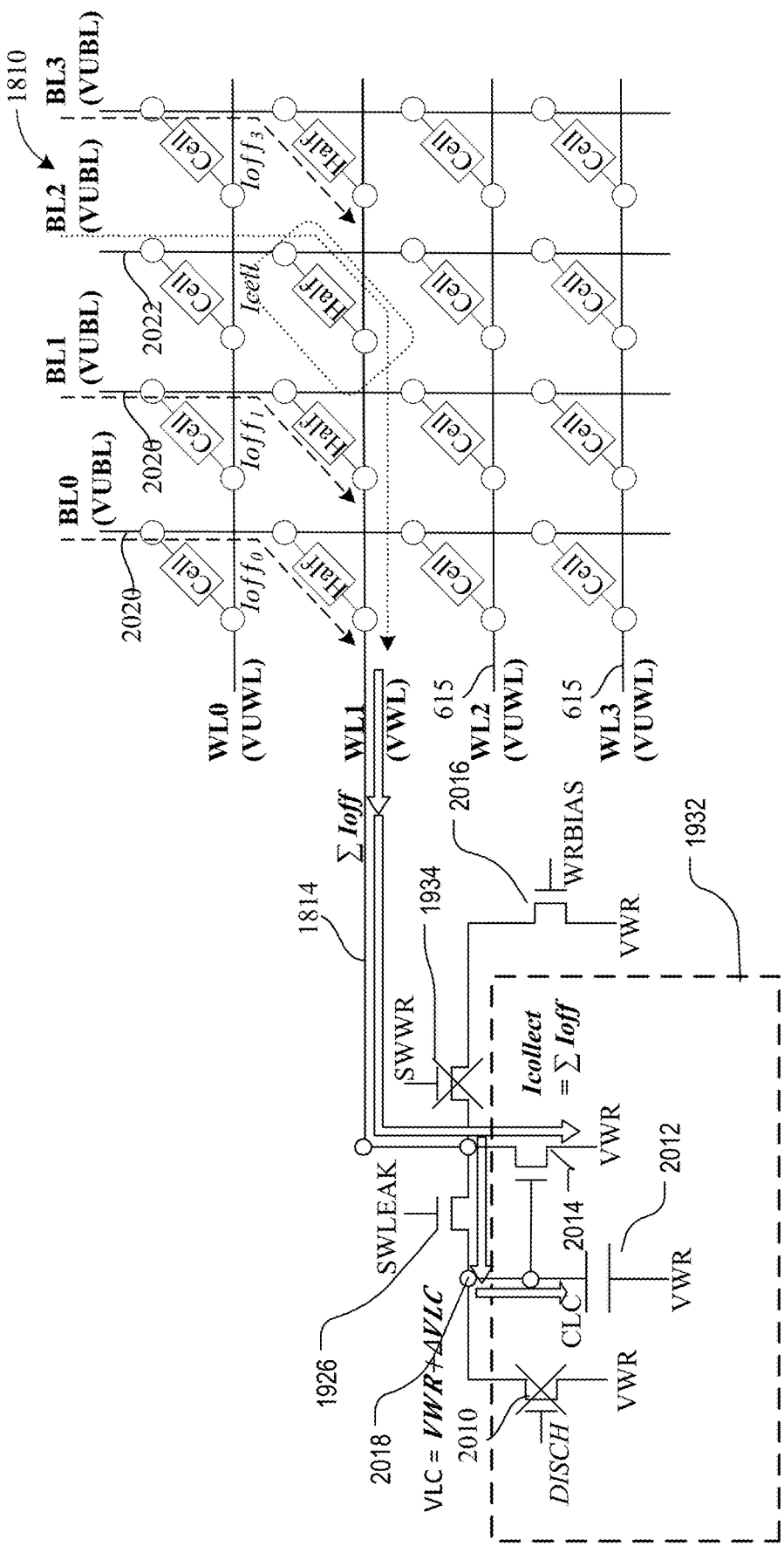
FIGS. 20a and 20b (collectively FIG. 20) are schematic diagrams illustrating a circuit implementation of the arrangement of FIGS. 19a and 19b, respectively.
Figure 20B:
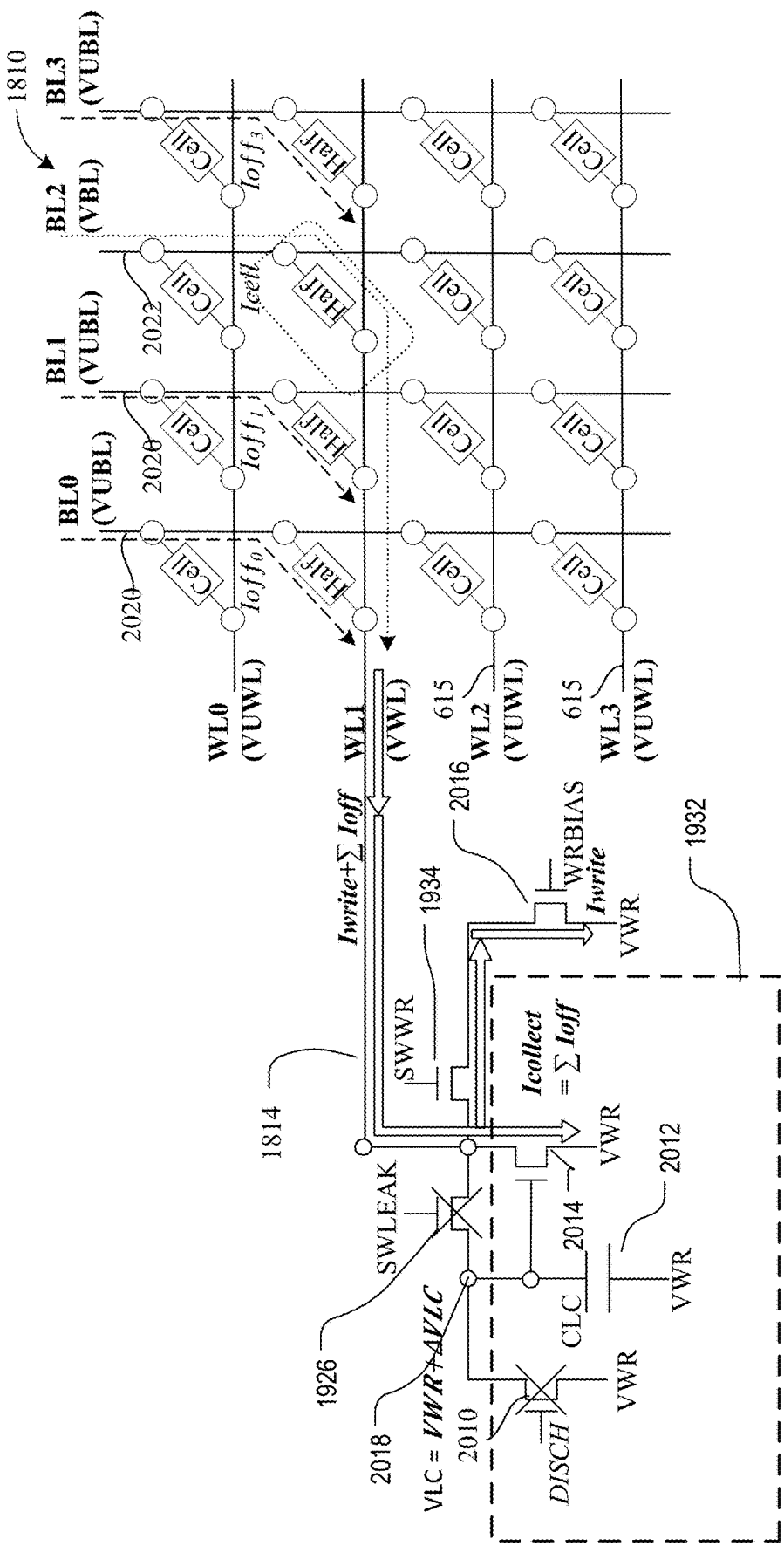

FIGS. 20*a* and 20*b* (collectively FIG. 20) are schematic diagrams illustrating a circuit implementation of the arrangement of FIGS. 19*a* and 19*b*, respectively. In FIG. 20, the memory array 1810 has been redrawn in accordance with the 4×4 array as shown in FIG. 1B. Also, the Write Current Generator 1920 has been implemented as transistor 2016 to a voltage VWR, biased by a write bias voltage WRBIAS applied to the gate terminal. Leakage Current Collector 1932 has been redrawn in schematic form and the two switches 1926 and 1934 have been redrawn as pass transistors. The Leakage Current collector 1932 includes a transistor 2014 series-connected from the word line 1814 to VWR, whose gate terminal is connected through a capacitor 2012 to VWR. The gate terminal of transistor 2014 is also connected to a node 2018, which is series connected through pass transistor 1926 to the word line 1814. The node 2018 is also series connected through a discharge transistor 2010 to VWR, whose gate conductor is connected to a Discharge voltage for resetting the charge on capacitor 2012 to zero when appropriate.

In the first segment of a write operation, VWL is applied to the selected word line 1814 while VUBL is applied to all of the bit lines 2020, 2022. Pass transistor 1926 is conducting while pass transistor 1934 is not. The leakage current that the array then drives onto the word line 1814 partially charges capacitor 2012 until the voltage on the gate of transistor 2014 is the correct voltage for the transistor 2014 to pass the actual leakage current. This leakage current amount is captured in the form of charge on capacitor 2012. As mentioned, this leakage current is dependent upon the data values stored in each of the cells that share word line 1814. In the second segment of the write operation, illustrated in FIG. 20b, pass transistor 1926 is turned off while pass transistor 1934 is turned on. The write bias voltage WRBIAS is applied to the gate terminal of transistor 2016, which causes the transistor 2016 to draw the current Iwrite from the word line 1814. At the same time, the voltage captured on capacitor 2012 applies a bias voltage to the gate terminal of transistor 2014 which is the correct level so as to cause transistor 2014 to draw the leakage current Ileak from the word line 1814 (now called Ileak_captured). The total current drawn from word line 1814 is therefore Iwrite+ Ileak_captured. Since the amount of the leakage current Ileak that will be drawn through the unselected cells that share word line 1814 is the same as Ileak_captured, the remaining current, which is drawn through the selected cell, is Iwrite+Ileak_captured−Ileak, which equals the desired cell write current Iwrite.

All of the variations described elsewhere herein for the read operation context apply equally to the write operation context, and it will be apparent to the reader how to adapt them. This includes speed-up techniques by avoiding unnecessary first write segments, and forcing first write segments anyway where the stored leakage detection bias is no longer considered valid.

The above techniques can be applied to done in any memory with a cross bar array structure. Examples include phase change memory (PCM), resistive random access memory (RRAM), magnetoresistive random access memory (MRAM), ferroelectric random access memory (FRAM), Flash memory, read-only memory (ROM), multi-level cross bar structures, and so on. Examples also include stacked structures which include a storage element series coupled with a device selection element, such as an Ovonic Threshold Switching (PCM+OTS) selector device. In addition, the read operations in which the above techniques can be applied include any operation of which a read operation forms a part. This includes a simple read, write verify, set verify, reset verify, program verify, erase verify, and so on.

The flow chart logic of FIGS. 16, 3, 4, 17 can be implemented using processors programmed using computer programs stored in memory accessible to the computer systems and executable by the processors, by dedicated logic hardware, including digital/analog circuitry and field programmable integrated circuits, or by combinations of dedicated hardware and computer programs. As with all flowcharts herein, it will be appreciated that many of the steps can be combined, performed in parallel or performed in a different sequence without affecting the functions achieved. For example, in some embodiments the second read segment of a read operation occurs first, and the first read segment occurs second. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that in a specific embodiment, numerous additional steps for accomplishing other functions for that embodiment can be performed before, after and between those steps shown.

As used herein, a given signal, event or value is "responsive" to a predecessor signal, event or value if the predecessor signal, event or value influenced the given signal, event or value. If there is an intervening processing element, step or time period, the given signal, event or value can still be "responsive" to the predecessor signal, event or value. If the intervening processing element or step combines more than one signal, event or value, the signal output of the processing element or step is considered "responsive" to each of the signal, event or value inputs. If the given signal, event or value is the same as the predecessor signal, event or value, this is merely a degenerate case in which the given signal, event or value is still considered to be "responsive" to the predecessor signal, event or value. "Dependency" of a given signal, event or value upon another signal, event or value is defined similarly.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention.

The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A method for reading data from a first target memory cell and a second target memory cell in an array of memory cells, each of the memory cells in the array providing a resistive current path between one of a plurality of primary access lines and one of a plurality of secondary access lines, each of primary access lines being shared among a plurality of the memory cells in the array and each of the secondary access lines being shared among more than one of the memory cells in the array, the primary access line of the first target memory cell being a first one of the primary access lines and the secondary access line of the first target memory cell being a first one of the secondary access lines, the primary access line of the second target memory cell being a second one of the primary access lines and the secondary access line of the second target memory cell being the first one of the secondary access lines, the current path provided by each particular one of the memory cells in the array having a resistance which is higher if the particular cell is in a first logic state than if the particular cell is in a second logic state, the method comprising, during a read operation addressing the first target memory cell:
- during a first segment of read operation, capturing as a reference current value a value dependent upon a current level on the first secondary access line;
- during a second segment of read operation to read the first target memory cell, selecting the first target memory cell to capture as a read current value a value dependent upon a current level on the first secondary access line;
- determining the logic state of the first target memory cell in dependence upon the read current value and the reference current value from the first segment;
- during a second segment of read operation to read the second target memory cell, selecting the second target memory cell to capture as another read current value another value dependent upon another current level on the first secondary access line; and
- determining the logic state of the second target memory cell in dependence upon the another read current value and the reference current value from the first segment.

2. The method of claim 1, wherein selecting the first target memory cell comprises applying a read selection voltage difference across the first primary access lines and the first secondary access line while applying voltage differences smaller than the read selection voltage difference across each of the memory cells in the memory array which are not the first target memory cell.

3. The method of claim 2, wherein applying a read selection voltage difference across the first primary access lines and the first secondary access line comprises:
- applying a primary access line read selection voltage to the first primary access line;
- applying a primary access line read non-selection voltage to all of the primary access lines in the array other than the first primary access line;
- applying a secondary access line read selection voltage to the first secondary access line; and
- applying a secondary access line read non-selection voltage to all of the secondary access lines in the array other than the first secondary access line.

4. The method of claim 1, wherein determining the logic state of the first target memory cell comprises:
- determining a level of leakage current on the first secondary access line, based on the reference current value, wherein level of leakage current on the first secondary access line is in dependence upon a number of memory cells sharing the first secondary access line which are in the first logic state and a number of memory cells sharing the first secondary access line which are in the second logic state.

5. The method of claim 4, wherein determining a level of leakage current on the first secondary access line comprises:
- applying a primary access line read non-selection voltage to all of the primary access lines in the array;
- applying a secondary access line read selection voltage to the first secondary access line; and
- applying a secondary access line read non-selection voltage to all of the secondary access lines in the array other than the first secondary access line.

6. The method of claim 1, comprising:
concurrently within the first segment of the read operation:
- applying a primary access line read non-selection voltage to all of the primary access lines in the array,
- applying a secondary access line read selection voltage to the first secondary access line, and
- applying a secondary access line read non-selection voltage to all of the secondary access lines in the array other than the first secondary access line, wherein capturing as the reference current value comprises
- capturing as the reference current value the value dependent upon the current level on the first secondary access line resulting from the first segment of the read operation; and concurrently within the second segment of the read operation to read the first target memory cell:
- applying a primary access line read selection voltage to the first primary access line,
- applying the primary access line read non-selection voltage to all of the primary access lines in the array other than the first primary access line,
- applying the secondary access line read selection voltage to the first secondary access line, and
- applying a secondary access line read non-selection voltage to all of the secondary access lines in the array other than the first secondary access line, wherein capturing as the read current value comprises
- capturing as the read current value the value dependent upon the current level on the first secondary access line resulting from the second segment of the read operation, wherein determining the logic state of the first target memory cell comprises
- determining the logic state of the first target memory cell in dependence upon a difference between the read current value and the reference current value.

7. The method of claim 6, wherein capturing as a reference current value a value dependent upon a current level on the first secondary access line resulting from the first segment of the read operation comprises charging a reference capacitance with a sum of current from the first secondary access line and a predetermined reference current,
and wherein capturing as a read current value a value dependent upon a current level on the first secondary access line resulting from the second segment of the read operation comprises charging a sense capacitance with current from first secondary access line,
and wherein determining the logic state of the first target memory cell comprises comparing a voltage across the charged reference capacitance with a voltage across the charged sense capacitance.

8. The method of claim 7, wherein capturing as a reference current value a value dependent upon a current level on the first secondary access line resulting from the first segment of the read operation further comprises pre-charging the reference capacitance to a predetermined voltage prior to charging the reference capacitance with the sum of current from the first secondary access line and the predetermined reference current,
and wherein capturing as a read current value a value dependent upon a current level on the first secondary access line resulting from the second segment of the read operation comprises pre-charging the sense capacitance to a predetermined voltage prior to charging a sense capacitance with current from first secondary access line.

9. The method of claim 6, for use with a reference array of reference cells each providing a resistive current path between the reference primary access line and a respective one of the plurality of secondary access lines,
wherein capturing as a reference current value a value dependent upon a current level on the first secondary access line resulting from the first segment of the read operation comprises, also concurrently within the applying steps in the first segment of the read operation:
applying primary access line reference voltage to the reference primary access line; and
charging a reference capacitance with current from the first secondary access line,
and wherein capturing as a read current value a value dependent upon a current level on the first secondary access line resulting from the second segment of the read operation comprises, also concurrently within the applying steps in the second segment of the read operation:
applying the primary access line read non-selection voltage to the reference primary access line; and
charging a sense capacitance with current from first secondary access line,
and wherein determining the logic state of the first target memory cell comprises comparing a voltage across the charged reference capacitance with a voltage across the charged sense capacitance.

10. The method of claim 1, wherein the primary access lines are one of bit lines or word lines of the array, and the secondary access lines are another of bit lines or word lines of the array.

11. The method of claim 1, wherein determining the logic state of the first target memory cell further comprises:
determining the logic state of the first target memory cell in dependence upon a difference between the read current value and the reference current value.

12. The method of claim 1, for use in reading data further from a third target memory cell in the array of memory cells, the secondary access line of the third target memory cell being a second one of the secondary access lines,
wherein determining the logic state of the first target memory cell comprises:
capturing as the reference current value the value that is further dependent upon a number of memory cells sharing the first secondary access line which are in the first logic state and a number of memory cells sharing the first secondary access line which are in the second logic state, the method further comprising:
making a determination of validity of the captured reference current value for a data read operation addressing the third target memory cell; and
if the determination of validity indicates that the captured reference current value is valid for a data read operation addressing the third target memory cell, then
selecting the third target memory cell to capture a second read current value on the second primary access line; and
determining the logic state of the third target memory cell in dependence upon the second read current, and further in dependence upon the captured reference current value.

13. The method of claim 12, wherein making a determination of validity comprises determining that the reference current value is not valid for a data read operation addressing the third target memory cell if the second secondary access line differs from the first secondary access line.

14. The method of claim 12, wherein making a determination of validity comprises determining that the reference current value is not valid for a data read operation addressing the third target memory cell if a predetermined amount of time has passed since the reference current value was captured.

15. The method of claim 12, wherein making a determination of validity comprises determining that the reference current value is not valid for a data read operation addressing the third target memory cell if at least a predetermined number N of intervening read operations have been performed on cells of the array since the reference current value was captured, N>1.

16. The method of claim 12, wherein making a determination of validity comprises determining that the reference current value is not valid for a data read operation addressing the third target memory cell if the reference current value has fallen below a predetermined minimum value.

17. An integrated circuit comprising:
an array of memory cells, each of the memory cells in the array providing a resistive current path between one of a plurality of primary access lines and one of a plurality of secondary access lines, each of primary access lines being shared among a plurality of the memory cells in the array and each of the secondary access lines being shared among more than one of the memory cells in the array, the primary access line of a first target memory cell being a first one of the primary access lines and the secondary access line of the first target memory cell being a first one of the secondary access lines, the primary access line of a second target memory cell being a second one of the primary access lines and the secondary access line of the second target memory cell being the first one of the secondary access lines, the current path provided by each particular one of the memory cells in the array having a resistance which is higher if the particular cell is in a first logic state than if the particular cell is in a second logic state;
a controller coupled to the array of memory cells to provide bias voltage arrangements to the primary and secondary access lines of the array in a read operation addressing the first target memory cell, the bias voltage arrangements including
a first bias arrangement which generates a leakage current on the first secondary access line in dependence upon the logic states of all the memory cells in the array which share the first secondary access line, and
a second bias arrangement which generates a read current on the first secondary access line in dependence upon both the logic state of the first target memory cell and the logic states of all other ones of the memory cells in the array which share the first secondary access line; and
sense circuitry which detects the logic state of the first target memory cell in dependence upon both the read current generated while the second bias arrangement is applied and the leakage current generated while the first bias arrangement is applied,
wherein the controller is to provide further bias voltage arrangements to the primary and secondary access lines of the array in another read operation addressing the second target memory cell, the further bias voltage arrangements including
a third bias arrangement which generates another read current on the first secondary access line in dependence upon both the logic state of the second target memory cell and the logic states of all other ones of the memory cells in the array which share the first secondary access line, wherein sense circuitry detects the logic state of the second target memory cell in dependence upon both the read current generated while the third bias arrangement is applied and the leakage current generated while the first bias arrangement is applied.

18. A method for reading data from a first target memory cell in an array of memory cells, each of the memory cells in the array providing a resistive current path between one of a plurality of primary access lines and one of a plurality of secondary access lines, each of primary access lines being shared among a plurality of the memory cells in the array and each of the secondary access lines being shared among more than one of the memory cells in the array, the primary access line of the first target memory cell being a first one of the primary access lines and the secondary access line of the first target memory cell being a first one of the secondary access lines, the current path provided by each particular one of the memory cells in the array having a resistance which is higher if the particular cell is in a first logic state than if the particular cell is in a second logic state, the method comprising, during a read operation addressing the first target memory cell:

concurrently within a first segment of the read operation:
  applying a primary access line read non-selection voltage to all of the primary access lines in the array,
  applying a secondary access line read selection voltage to the first secondary access line, and
  applying a secondary access line read non-selection voltage to all of the secondary access lines in the array other than the first secondary access line;
capturing as a reference current value a value dependent upon a current level on the first secondary access line resulting from the first segment of the read operation;
concurrently within a second segment of the read operation:
  applying a primary access line read selection voltage to the first primary access line,
  applying the primary access line read non-selection voltage to all of the primary access lines in the array other than the first primary access line,
  applying the secondary access line read selection voltage to the first secondary access line, and
  applying a secondary access line read non-selection voltage to all of the secondary access lines in the array other than the first secondary access line;
capturing as a read current value a value dependent upon a current level on the first secondary access line resulting from the second segment of the read operation; and
determining the logic state of the first target memory cell in dependence upon a difference between the read current value and the reference current value.

19. The method of claim 18, wherein capturing as a reference current value a value dependent upon a current level on the first secondary access line resulting from the first segment of the read operation comprises charging a reference capacitance with a sum of current from the first secondary access line and a predetermined reference current, and wherein capturing as a read current value a value dependent upon a current level on the first secondary access line resulting from the second segment of the read operation comprises charging a sense capacitance with current from first secondary access line, and wherein determining the logic state of the first target memory cell comprises comparing a voltage across the charged reference capacitance with a voltage across the charged sense capacitance.

20. The method of claim 19, wherein capturing as a reference current value a value dependent upon a current level on the first secondary access line resulting from the first segment of the read operation further comprises pre-charging the reference capacitance to a predetermined voltage prior to charging the reference capacitance with the sum of current from the first secondary access line and the predetermined reference current, and wherein capturing as a read current value a value dependent upon a current level on the first secondary access line resulting from the second segment of the read operation comprises pre-charging the sense capacitance to a predetermined voltage prior to charging a sense capacitance with current from first secondary access line.

21. The method of claim 18, for use with a reference array of reference cells each providing a resistive current path between the reference primary access line and a respective one of the plurality of secondary access lines, wherein capturing as a reference current value a value dependent upon a current level on the first secondary access line resulting from the first segment of the read operation comprises, also concurrently within the applying steps in the first segment of the read operation:
  applying primary access line reference voltage to the reference primary access line; and
  charging a reference capacitance with current from the first secondary access line, and wherein capturing as a read current value a value dependent upon a current level on the first secondary access line resulting from the second segment of the read operation comprises, also concurrently within the applying steps in the second segment of the read operation:
  applying the primary access line read non-selection voltage to the reference primary access line; and
  charging a sense capacitance with current from first secondary access line, and wherein determining the logic state of the first target memory cell comprises comparing a voltage across the charged reference capacitance with a voltage across the charged sense capacitance.

* * * * *